(12) United States Patent
Kwon et al.

(10) Patent No.: US 11,363,728 B2
(45) Date of Patent: Jun. 14, 2022

(54) DISPLAY DEVICE

(71) Applicant: LG Display Co., Ltd., Seoul (KR)

(72) Inventors: Hoiyong Kwon, Seoul (KR); JiHun Song, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/922,364

(22) Filed: Jul. 7, 2020

(65) Prior Publication Data

US 2021/0029840 A1  Jan. 28, 2021

(30) Foreign Application Priority Data

Jul. 26, 2019 (KR) .......................... 10-2019-0090982

(51) Int. Cl.
*H05K 5/02* (2006.01)
*H05K 5/03* (2006.01)
*H05K 5/00* (2006.01)

(52) U.S. Cl.
CPC .......... *H05K 5/0217* (2013.01); *H05K 5/0017* (2013.01); *H05K 5/03* (2013.01)

(58) Field of Classification Search
CPC ...... H05K 5/0217; H05K 5/03; H05K 5/0017; G09F 9/301; G09F 9/33; G09F 9/35; G06F 1/1652
See application file for complete search history.

(56) References Cited

U.S. PATENT DOCUMENTS 7,710,370 B2 * 5/2010 Slikkerveer ............. G09F 9/301
345/85
9,684,340 B2 * 6/2017 Han ...................... G09G 3/3233
9,743,542 B2   8/2017 Heo et al.
9,844,152 B2  12/2017 Heo et al.
10,186,681 B2 * 1/2019 Kang ...................... H01L 27/32
(Continued)

FOREIGN PATENT DOCUMENTS

EP   3173855 A1   5/2017
EP   3173897 A1   5/2017
(Continued)

OTHER PUBLICATIONS

Combined Search and Examination report dated Jan. 15, 2021, issued in corresponding UK Patent Application No. GB2011115.9.

*Primary Examiner* — Hung S. Bui
*Assistant Examiner* — Sagar Shrestha
(74) *Attorney, Agent, or Firm* — Morgan, Lewis & Bockius LLP

(57) ABSTRACT

A display device includes a display panel in which a plurality of pixels is defined. The display device further includes a back cover configured to be rolled together with the display panel. The display device further includes a roller winding or unwinding the back cover and the display panel, and including a flat surface and a curved surface. The display device further includes a buffer member covering at least a part of the back cover fixed to the roller, and having a width smaller than a width of the display panel. Therefore, the display panel is wound around the roller with a gentle slope, and non-display areas on both side portions of the display panel are wound around a roller with a space by the buffer member. Accordingly, a stress applied to the display panel and a crack may be reduced to improve reliability of the display device.

20 Claims, 18 Drawing Sheets

(56) References Cited

U.S. PATENT DOCUMENTS

| | | | |
|---|---|---|---|
| 10,257,945 B2* | 4/2019 | Kim | G06F 1/1652 |
| 10,362,690 B2 | 7/2019 | Han | |
| 10,390,443 B2 | 8/2019 | Kim et al. | |
| 10,424,229 B2* | 9/2019 | Kim | G02F 1/133308 |
| 10,847,066 B2* | 11/2020 | Lee | G09F 9/301 |
| 2008/0247126 A1* | 10/2008 | Otsuka | G06F 1/1601 |
| | | | 361/679.06 |
| 2015/0227171 A1* | 8/2015 | Choi | G06F 1/1652 |
| | | | 361/749 |
| 2017/0031388 A1* | 2/2017 | Han | G09G 3/3233 |
| 2017/0222178 A1* | 8/2017 | Kang | H01L 27/3276 |
| 2017/0318688 A1* | 11/2017 | Kim | H05K 1/147 |
| 2017/0318689 A1* | 11/2017 | Kim | G03B 21/58 |
| 2017/0367198 A1* | 12/2017 | Park | H01L 51/5237 |
| 2018/0114471 A1* | 4/2018 | Park | G09F 9/301 |
| 2018/0173277 A1* | 6/2018 | Lee | H01L 27/3276 |
| 2018/0341142 A1* | 11/2018 | Choi | G06F 1/1643 |
| 2019/0064881 A1* | 2/2019 | Kim | G02F 1/13452 |
| 2019/0150300 A1 | 5/2019 | Kim et al. | |
| 2020/0084897 A1 | 3/2020 | Shin et al. | |
| 2020/0205301 A1 | 6/2020 | Song | |
| 2020/0394942 A1 | 12/2020 | Kim et al. | |
| 2021/0007230 A1* | 1/2021 | Kang | H05K 5/03 |
| 2021/0144868 A1* | 5/2021 | Song | H05K 5/0017 |

FOREIGN PATENT DOCUMENTS

| | | |
|---|---|---|
| EP | 3419073 A1 | 12/2018 |
| GB | 2577401 | 3/2020 |
| KR | 10-2017-0006012 A | 1/2017 |
| KR | 10-2017-0006013 A | 1/2017 |
| KR | 10-2017-0062343 A | 6/2017 |
| KR | 10-2018-0027318 A | 3/2018 |
| KR | 10-2020-0030265 A | 3/2020 |
| WO | 2020251152 A1 | 12/2020 |

* cited by examiner

DISPLAY DEVICE

CROSS-REFERENCE TO RELATED APPLICATIONS

This application claims the priority of Korean Patent Application No. 10-2019-0090982 filed on Jul. 26, 2019, in the Korean Intellectual Property Office, the disclosure of which is incorporated herein by reference.

BACKGROUND

Technical Field

The present disclosure relates to a display device, and more particularly, to a rollable display device which is capable of displaying images even in a rolled state.

Discussion of the Related Art

As display devices which are used for a monitor of a computer, a television, or a cellular phone, there are an organic light emitting display device (OLED) which is a self-emitting device and a liquid crystal display device (LCD) which requires a separate light source.

An applicable range of the display device is diversified to personal digital assistants as well as monitors of computers and televisions and a display device with a large display area and a reduced volume and weight is being studied.

Further, recently, a rollable display device which is manufactured by forming a display part and a wiring line on a flexible substrate such as plastic which is a flexible material so as to be capable of displaying images even though the display device is rolled is getting attention as a next generation display device.

SUMMARY

Accordingly, embodiments of the present disclosure are directed to a display device that substantially obviates one or more of the problems due to limitations and disadvantages of the related art.

An object to be achieved by the present disclosure is to provide a display device which disposes a buffer member in a partial area of a roller to minimize a stress applied to a display panel.

Another object to be achieved by the present disclosure is to provide a display device which suppresses a crack of a driving part disposed in a non-display area of a display panel to improve a reliability.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described, there is provided a display device. The display device includes a display panel in which a plurality of pixels is defined. The display device further includes a back cover configured to be rolled together with the display panel. The display device further includes a roller winding or unwinding the back cover and the display panel, and including a flat surface and a curved surface. The display device further includes a buffer member covering at least a part of the back cover fixed to the roller, and having a width smaller than a width of the display panel.

According to another aspect of the present disclosure, there is provided a display device. The display device includes a display panel including a display area and a non-display area on both side portions of the display area. The display device further includes a back cover configured to be rolled together with the display panel. The display device further includes a roller winding or unwinding the back cover and the display panel, and including a flat surface and a curved surface. The display device further includes a buffer member covering at least a part of the back cover fixed to the roller, and disposed so as to correspond to the display area of the display panel.

Other detailed matters of the exemplary embodiments are included in the detailed description and the drawings.

According to the present disclosure, a buffer member is provided so that non-display areas on both side portions of a display panel are wound around a roller with a space. Therefore, the crack of the driving part disposed in the non-display area is suppressed so that the reliability of the display device may be improved.

According to the present disclosure, the display panel is wound around the roller with a gentle slope by the buffer member so that the stress applied to the display panel may be minimized.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain various principles. In the drawings.

DETAILED DESCRIPTION

Figure 1A:
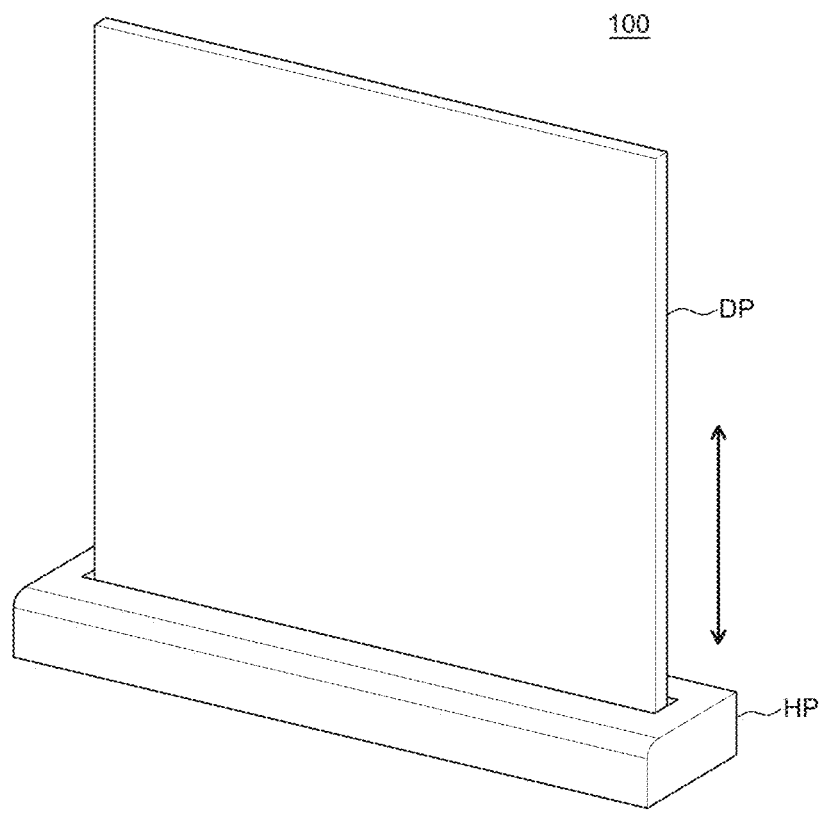
FIGS. 1A and 1B are perspective views of a display device according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, the present disclosure will be described in detail with reference to accompanying drawings <Display Device-Rollable Display Device>

A rollable display device may be referred to as a display device which is capable of displaying images even though the display device is rolled. The rollable display device may have a high flexibility as compared with a general display device of the related art. Depending on whether to use a rollable display device, a shape of the rollable display device may freely vary. Specifically, when the rollable display device is not used, the rollable display device is rolled to be stored with a reduced volume. In contrast, when the rollable display device is used, the rolled rollable display device is stretched again to be used.

Figure 1B:
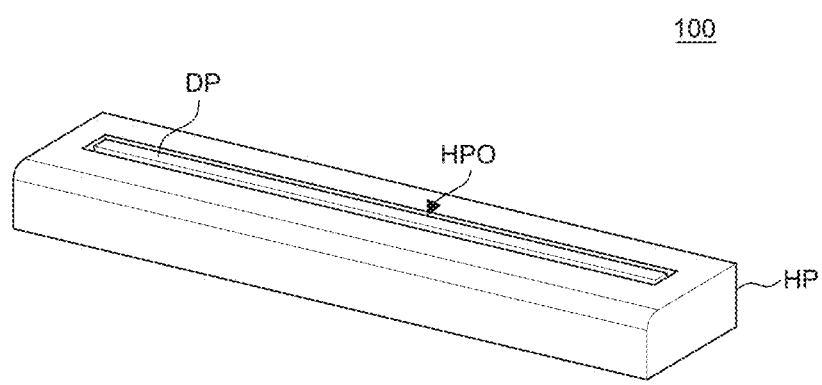

FIGS. 1A and 1B are perspective views of a display device according to an exemplary embodiment of the present disclosure.

Referring to FIGS. 1A and 1B, a display device 100 according to an exemplary embodiment of the present disclosure includes a display part DP and a housing part HP.

The display part DP is a configuration for displaying images to a user and for example, in the display part, a display element and a circuit, a wiring line, and a component for driving the display element may be disposed. In this case, since the display device 100 according to an exemplary embodiment of the present disclosure is a rollable display device 100, the display part DP may be configured to be capable of being wound and unwound. For example, the display part DP may be formed of a display panel and a back cover each having flexibility to be wound or unwound. The display part DP will be described below in more detail with reference to FIGS. 4 and 5.

The housing part HP is a case in which the display part DP is accommodated. The display part DP may be wound to be accommodated in the housing part HP and the display part DP may be unwound to be disposed at the outside of the housing part HP.

The housing part HP has an opening HPO so that the display part DP is allowed to move to the inside and the outside of the housing part HP. The display part DP may move in a vertical direction by passing through the opening HPO of the housing part HP.

In the meantime, the display part DP of the display device 100 may be switched from a fully unwound state to a fully wound state or from a fully wound state to a fully unwound state.

FIG. 1A illustrates the display part DP of the display device 100 which is fully unwound and in the fully unwound state, the display part DP of the display device 100 is disposed at the outside of the housing part HP. That is, in order for a user to watch images through the display device 100, when the display part DP is unwound to be disposed at the outside of the housing part HP as much as possible and cannot be further unwound any more, it may be defined as a fully unwound state.

FIG. 1B illustrates the display part DP of the display device 100 which is fully wound and in the fully wound state, the display part DP of the display device 100 is accommodated in the housing part HP and cannot be further wound. That is, when the user does not watch the images through the display device 100, it is advantageous from the viewpoint of an outer appearance when the display part DP is not disposed at the outside of the housing part HP. Therefore, when the display part DP is wound to be accommodated in the housing part HP, it is defined as a fully wound state. Further, when the display part DP is in a fully wound state to be accommodated in the housing part HP, a volume of the display device 100 is reduced and the display device 100 may be easily carried.

In the meantime, in order to switch the display part DP to a fully unwound state or a fully wound state, a moving part which winds or unwinds the display part DP is disposed.

<Moving Part>

Figure 2:
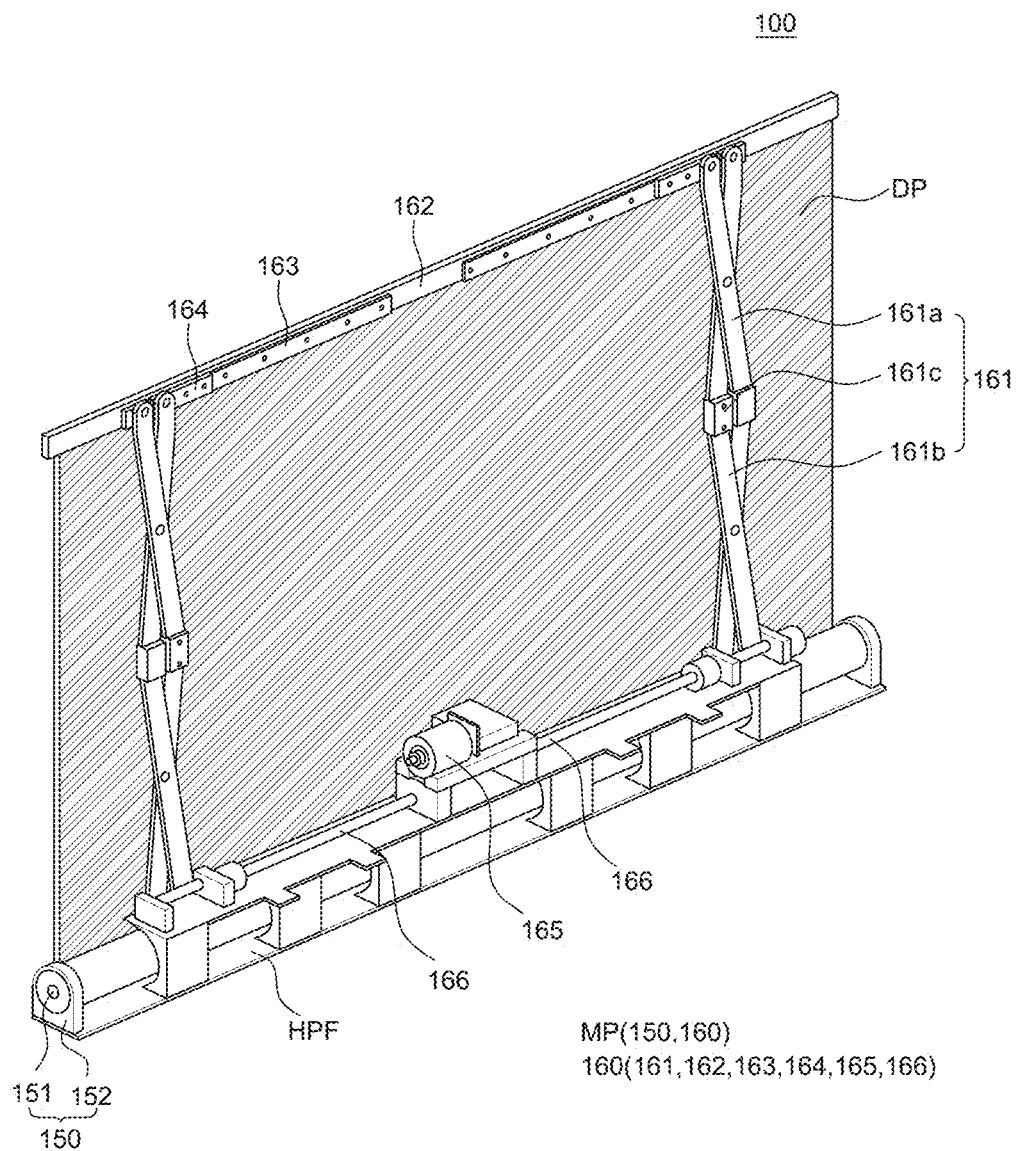
FIG. 2 is an exploded perspective view of a display device according to an exemplary embodiment of the present disclosure.
Figure 3:
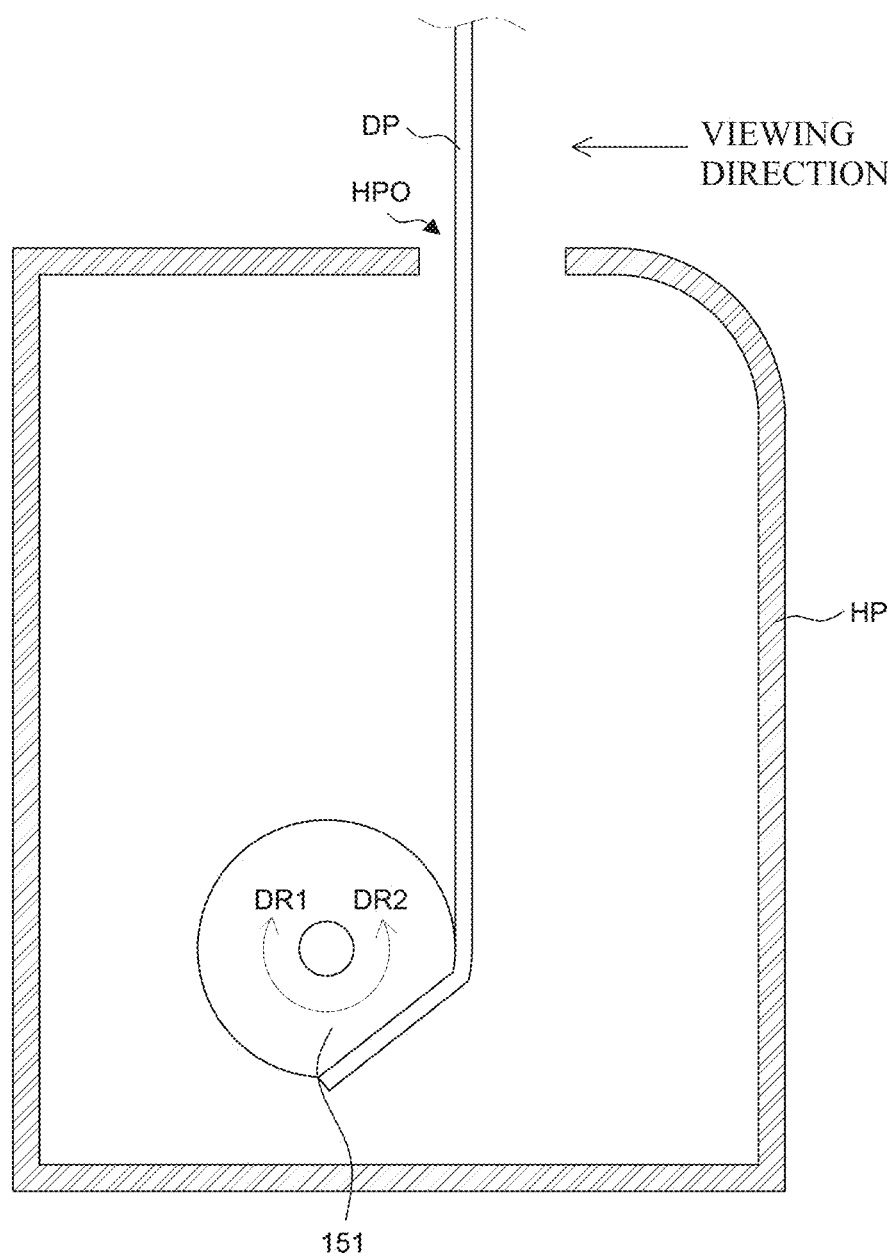
FIG. 3 is a cross-sectional view of a display device according to an exemplary embodiment of the present disclosure.

FIG. 2 is an exploded perspective view of a display device according to an exemplary embodiment of the present disclosure. FIG. 3 is a cross-sectional view of a display device according to an exemplary embodiment of the present disclosure. FIG. 3 is a schematic cross-sectional view for explaining a roller 151 and a display part DP of a display device 100 according to an exemplary embodiment of the present disclosure. For the convenience of description, in FIG. 3, only a housing part HP, a roller 151, and a display part DP are illustrated.

First, referring to FIG. 2, a moving part MP includes a roller unit 150 and a lifting unit 160.

The roller unit 150 rotates in a clockwise direction or a counterclockwise direction to wind or unwind the display part DP fixed to the roller unit 150. The roller unit 150 includes a roller 151 and a roller support unit 152.

The roller 151 is a member around which the display part DP is wound. The roller 151 may be, for example, formed to have a cylindrical shape. A lower edge of the display part DP may be fixed to the roller 151. When the roller 151 rotates, the display part DP which is fixed to the roller 151 through the lower edge may be wound around the roller 151. In contrast, when the roller 151 rotates in an opposite direction, the display part DP which is wound around the roller 151 may be unwound from the roller 151.

Referring to FIG. 3, the roller 151 may be formed to have a cylindrical shape in which at least a part of an outer circumferential surface of the roller 151 is flat and the remaining part of the outer circumferential surface is a curved surface. Even though the roller 151 may be entirely a cylindrical shape, but a part thereof may be formed as a flat surface. That is, a part of the outer circumferential surface of the roller 151 is formed to be a flat surface and the remaining part of the outer circumferential surface is formed to be a curved surface. The flat surface of the roller 151 may be a part in which the plurality of flexible films 130 and the printed circuit board 135 (see FIG. 4) of the display part DP are seated. However, the roller 151 may have a completely cylindrical shape or an arbitrary shape which may wind the display part DP, but is not limited thereto.

Referring to FIG. 2 again, the roller support unit 152 supports the roller 151 at both sides of the roller 151. Specifically, the roller support unit 152 is disposed on a bottom surface HPF of the housing part HP. Further, upper sides of the roller support unit 152 are coupled to both ends of the roller 151. By doing this, the roller support unit 152 may support the roller 151 to be spaced apart from the bottom surface HPF of the housing part HP. In this case, the roller 151 may be rotatably coupled to the roller support unit 152.

The lifting unit 160 moves the display part DP in a vertical direction in accordance with the driving of the roller unit 150. The lifting unit 160 includes a link unit 161, a head bar 162, a slide rail 163, a slider 164, a motor 165, and a rotary unit 166.

The link unit 161 of the lifting unit 160 includes a plurality of links 161a and 161b and a hinge unit 161c which connects the plurality of links 161a and 161b. Specifically, the plurality of links 161a and 161b includes a first link 161a and a second link 161b and the first link 161a and the second link 161b cross each other in the form of scissors to be rotatably fastened by means of the hinge unit 161c. When the link unit 161 moves in the vertical direction, the plurality of links 161a and 161b rotates to be far away from each other or close to each other.

The head bar 162 of the lifting unit 160 is fixed to an uppermost end of the display part DP. The head bar 162 is coupled to the link unit 161 to move the display part DP in the vertical direction in accordance with the rotation of the plurality of links 161a and 161b of the link unit 161. That is, the display part DP may move in a vertical direction by the head bar 162 and the link unit 161.

The head bar 162 covers only a part of a surface which is adjacent to an uppermost edge of the display part DP so as not to hide an image displayed on the front surface of the display part DP. The display part DP and the head bar 162 may be fixed by a screw, but are not limited thereto.

The slide rail 163 of the lifting unit 160 provides a movement path of the plurality of links 161a and 161b. Some of the plurality of links 161a and 161b is rotatably fastened with the slide rail 163 so that the motion is guided along a trajectory of the slide rail 163. Some of the plurality of links 161a and 161b is fastened with the slider 164 which is movably provided along the slide rail 163 to move along a trajectory of the slide rail 163.

The motor 165 is connected to a power generating unit, such as a separate external power source or a built-in battery, to be supplied with the power. The motor 165 generates a torque to provide a driving force to the rotary unit 166.

The rotary unit 166 is connected to the motor 165 to be configured to convert a rotational motion from the motor 165 into a linear reciprocating motion. That is, the rotational motion of the motor 165 may be converted into the linear reciprocating motion of a structure fixed to the rotary unit 166. For example, the rotary unit 166 may be implemented by a shaft and a ball screw including a nut which is fastened with the shaft, but is not limited thereto.

The motor 165 and the rotary unit 166 interwork with the link unit 161 to lift the display part DP. The link unit 161 is formed with a link structure to receive the driving force from the motor 165 and the rotary unit 166 to be repeatedly folded or unfolded.

Specifically, as the motor 165 is driven, the structure of the rotary unit 166 may perform the linear motion. That is, a part of the rotary unit 166 to which one end of the second link 161b is coupled may perform the linear motion. Therefore, one end of the second link 161b moves to the motor 165 and the plurality of links 161a and 161b are folded so that the height of the link unit 161 may be lowered. Further, while the plurality of links 161a and 161b is folded, the head bar 162 coupled to the first link 161a is also lowered and one end of the display part DP coupled to the head bar 162 is also lowered.

Accordingly, when the display part DP is fully wound around the roller 151, the link unit 161 of the lifting unit 160 maintains a folded state. That is, when the display part DP is fully wound around the roller 151, the lifting unit 160 may have a smallest height. When the display part DP is fully unwound, the link unit 161 of the lifting unit 160 maintains a stretched state. That is, when the display part DP is fully unwound, the lifting unit 160 may have a largest height.

In the meantime, when the display part DP is wound, the roller 151 may rotate and the display part DP may be wound around the roller 151. Referring to FIG. 3 together, a lower edge of the display part DP is coupled to the roller 151. When the roller 151 rotates in a first direction DR1, that is, a clockwise direction, the display part DP may be wound while a rear surface of the display part DP is in close contact with a front surface of the roller 151.

When the display part DP is unwound, the roller 151 may rotate and the display part DP may be unwound from the roller 151. For example, referring to FIG. 3, when the roller 151 rotates in a second direction DR2, that is, in a counter-clockwise direction, the display part DP which is wound around the roller 151 is unwound from the roller 151 to be disposed at the outside of the housing part HP.

In some exemplary embodiments, a moving part MP having another structure other than the above-described moving part MP may be applied to the display device 100. That is, as long as the display part DP is capable of being wound and unwound, the above-described configuration of the roller unit 150 and the lifting unit 160 may be modified, some configurations may be omitted, or another configuration may be added.

<Display Part>

Figure 4:
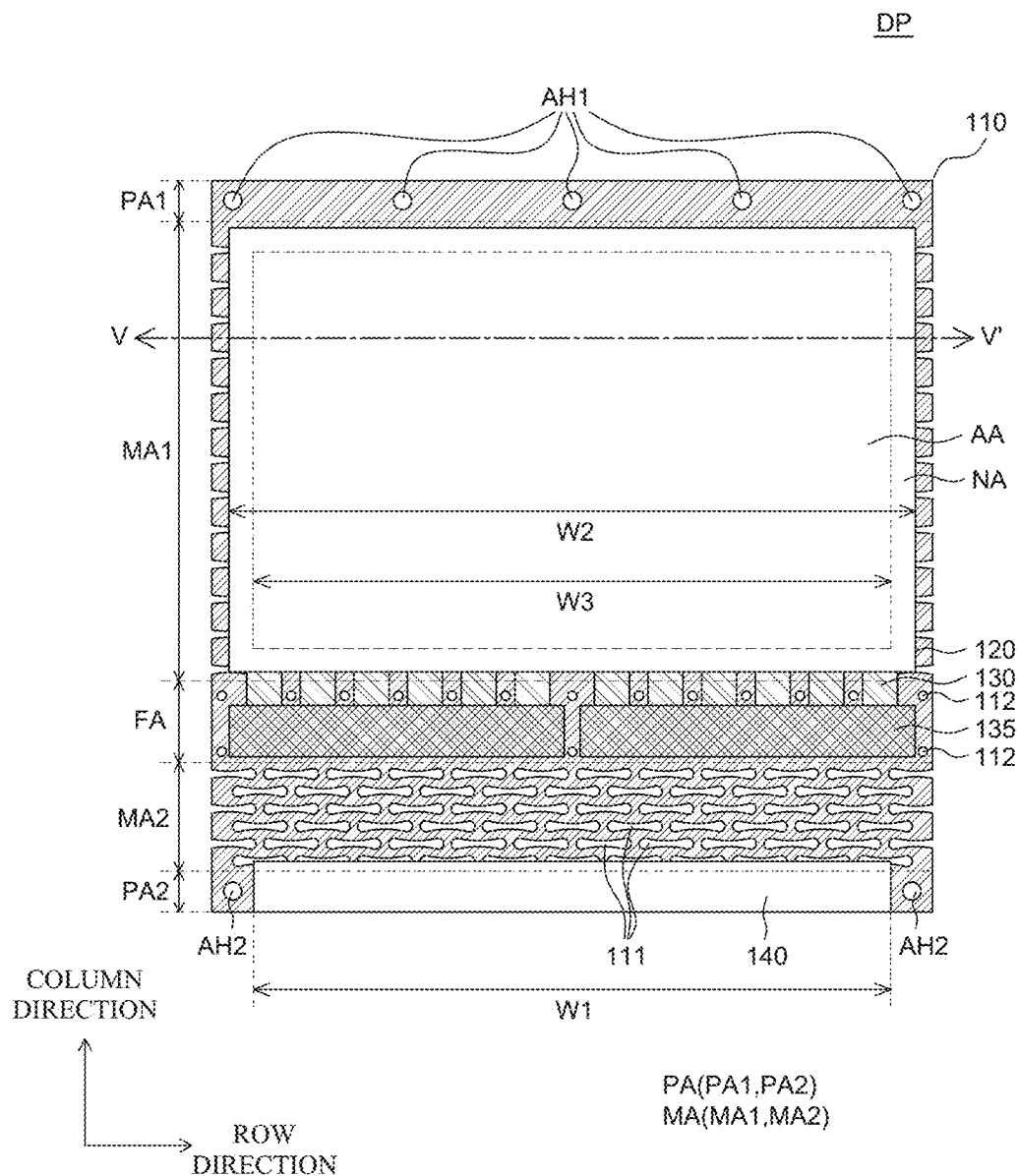
FIG. 4 is a plan view of a display part of a display device according to an exemplary embodiment of the present disclosure.
Figure 5:
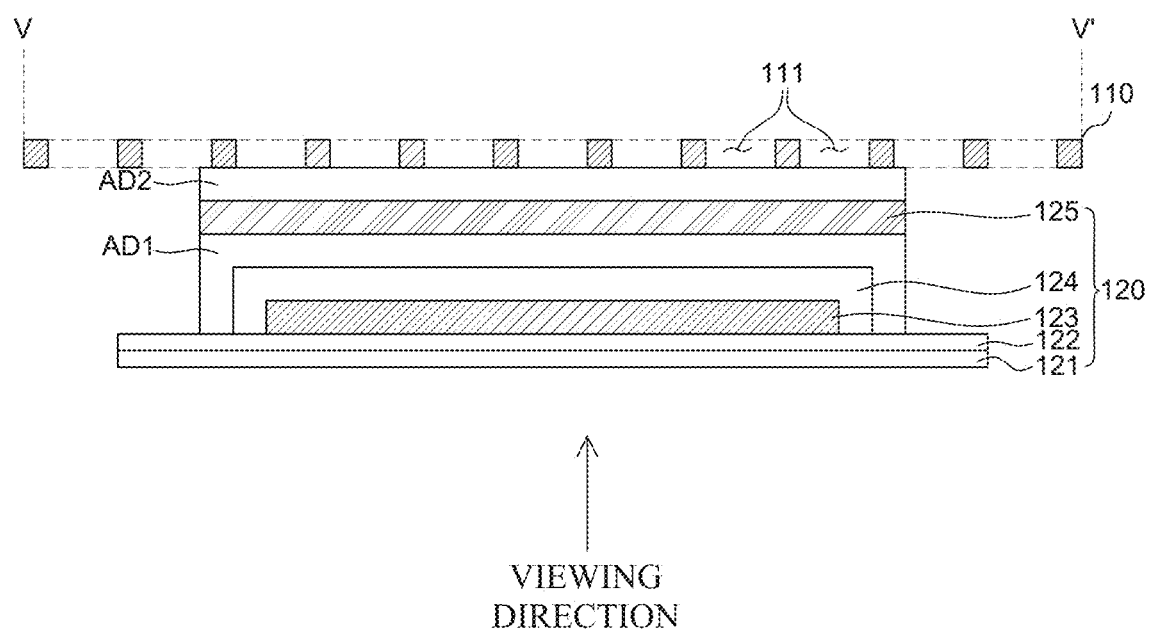
FIG. 5 is a cross-sectional view taken along the line V-V' of FIG. 4.

FIG. 4 is a plan view of a display part of a display device according to an exemplary embodiment of the present disclosure. FIG. 5 is a cross-sectional view taken along the line V-V' of FIG. 4. Referring to FIGS. 4 and 5, the display part DP of the display device 100 includes a back cover 110, a display panel 120, a flexible film 130, a printed circuit board 135, and a buffer member 140. Here, even though it is described that the buffer member 140 is included in the display part DP, the buffer member 140 may be a separate component from the display part DP.

Referring to FIGS. 4 and 5 first, the back cover 110 is disposed on rear surfaces of the display panel 120, the flexible film 130, the printed circuit board 135, and the buffer member 140 to support the display panel 120, the flexible film 130, the printed circuit board 135, and the buffer member 140. Therefore, a size of the back cover 110 may be larger than a size of the display panel 120. That is, an outer edge of the back cover 110 may be disposed at the outside more than a corresponding outer edge of the display panel 120. Therefore, when the display part DP is disposed at the outside of the housing part HP, the back cover 110 may protect another configuration of the display part DP, specifically, the display panel 120 from the external impact.

Even though the back cover 110 is formed of a material having a rigidity, at least a part of the back cover 110 may have a flexibility to be wound or unwound together with the display panel 120. For example, the back cover 110 may be formed of a metal material such as steel use stainless (SUS) or invar or plastic. However, if the material of the back cover 110 satisfies physical conditions such as a thermal strain amount, a radius of curvature, and a rigidity, the material may be diversely changed, and is not limited thereto.

The back cover 110 includes a fixing area FA, a support area PA, and a malleable area MA. Specifically, the fixing area FA is an area where the printed circuit board 135 and the flexible film 130 are fixed, the support area PA is an area where the plurality of openings 111 is not disposed, and the malleable area MA is an area where the plurality of openings 111 is disposed. In this case, the back cover 110 includes a first support area PA1 at an uppermost end, a second support area PA2 at a lowermost end, the fixing area FA between the first support area PA1 and the second support area PA2, and the malleable areas MA between the first support area PA1 and the fixing area FA and between the fixing area FA and the second support area PA2.

The first support area PA1 of the back cover 110 is an uppermost area of the back cover 110 and is fastened with the head bar 162. The first support area PA1 includes first fastening holes AH1 to be fastened with the head bar 162. Further, as described in detail with reference to FIG. 2, screws which pass through the head bar 162 and the first fastening holes AH1 are disposed to fasten the head bar 162 with the first support area PA1 of the back cover 110. Further, as the first support area PA1 is fastened with the head bar 162, when the link unit 161 which is fastened with the head bar 162 is lifted or lowered, the back cover 110 is also lifted and lowered together with the display panel 120 which is attached to the back cover 110. Even though five first fastening holes AH1 are illustrated in FIG. 4, the number of first fastening holes AH1 is not limited thereto. Further, even though it is described that the back cover 110 is fastened with the head bar 162 using the first fastening holes AH1 in FIG. 4, it is not limited thereto and the back cover 110 and the head bar 162 may be fastened with each other without using a separate fastening hole.

The second support area PA2 of the back cover 110 is a lowermost area of the back cover 110 and is fastened with the roller 151. The second support area PA2 may include second fastening holes AH2 to be fastened with the roller 151. For example, as it will be described below with reference to FIG. 8B, screws SC which pass through the roller 151 and the second fastening holes AH2 are disposed to fasten the roller 151 and the second support area PA2 of the back cover 110 with each other. Further, as the second support area PA2 is fastened with the roller 151, the back cover 110 may be wound around or unwound from the roller 151 by the rotation of the roller 151. Even though two second fastening holes AH2 are illustrated in FIG. 4, the number of second fastening holes AH2 is not limited thereto.

The fixing area FA of the back cover 110 is an area disposed between the first support area PA1 and the second support area PA2. In the fixing area FA, the flexible film 130 which is connected to one end of the display panel 120 and the printed circuit board 135 are disposed to be fixed.

In order to protect the flexible film 130 and the printed circuit board 135, the fixing area FA may allow the flexible film 130 and the printed circuit board 135 to be wound around the roller 151 in a flat shape, rather than a curved shape. Further, a part of the roller 151 may be formed to be flat, corresponding to the fixing area FA. A detailed description thereof will be made below with reference to FIGS. 7A to 8B.

In the fixing area FA, a plurality of fixing holes 112 is disposed. The plurality of fixing holes 112 is disposed between the flexible films 130 to more stably fix the flexible film 130 and the printed circuit board 135 together with the base plate 180 and the top cover 190 which are fastened through the plurality of fixing holes 112.

When the display part DP is wound or unwound, the flexible film 130 and the printed circuit board 135 disposed in the fixing area FA may be rocked without being fixed. Specifically, when the display part DP is wound or unwound, a stress due to contraction or expansion may be applied to the fixing area FA of the back cover 110. Therefore, the plurality of fixing holes 112 of the fixing area FA is formed to be fastened with the base plate 180 and the top cover 190 to fix the flexible film 130 and the printed circuit board 135 disposed between the base plate 180 and the top cover 190.

In the meantime, the number of the plurality of fixing holes 112 illustrated in FIG. 4 is illustrative and the number of the plurality of fixing holes 112 may be determined based on the number of printed circuit board 135 and the number of flexible films 130.

The malleable area MA of the back cover 110 is an area which is wound around or unwound from the roller 151 together with the display panel 120. The malleable area MA may overlap at least the display panel 120 among other configurations of the display part DP.

A plurality of openings 111 is disposed in the malleable area MA of the back cover 110. When the display part DP is wound or unwound, the plurality of openings 111 may be deformed by a stress which is applied to the display part DP. Specifically, when the display part DP is wound or unwound, the malleable area MA of the back cover 110 may be deformed as the plurality of openings 111 contracts or expands. Further, as the plurality of openings 111 contracts or expands, a slip phenomenon of the display panel 120 disposed on the malleable area MA of the back cover 110 is minimized so that the stress which is applied to the display panel 120 may be minimized.

When the back cover 110 and the display panel 120 are wound, a difference between a length of the back cover 110 which is wound around the roller 151 and a length of the display panel 120 which is wound around the roller 151 may be caused due to the difference of radii of curvature of the back cover 110 and the display panel 120. For example, when the back cover 110 and the display panel 120 are wound around the roller 151, a length of the back cover 110 required for being wound around the roller 151 once may be different from a length of the display panel 120 required for being wound around the roller 151 once. That is, since the display panel 120 is disposed outer than the back cover 110 with respect to the roller 151, a length of the display panel 120 required to be wound around the roller 151 once may be larger than a length of the back cover 110 required to be wound around the roller 151 once. As described above, the winding lengths of the back cover 110 and the display panel 120 are different from each other due to the difference of radii of curvature at the time of winding the display part DP and the display panel 120 attached to the back cover 110 may slide to move from its original position. In this case, a phenomenon that the display panel 120 slides from the back cover 110 due to the stress and the difference of radii of curvature caused by the winding may be defined as a slip phenomenon. When the slip phenomenon is excessively increased, the display panel 120 may be detached from the back cover 110 or failures such as cracks may be caused.

In this case, in the display device 100 according to an exemplary embodiment of the present disclosure, even though the display part DP is wound or unwound and a stress is applied to the display part DP, the plurality of openings 111 of the back cover 110 is flexibly deformed to alleviate the stress applied to the back cover 110 and the display panel 120. For example, when the back cover 110 and the display panel 120 are wound around the roller 151, a stress which deforms the back cover 110 and the display panel 120 in a vertical direction may be applied. In this case, the plurality of openings 111 of the back cover 110 may extend in a vertical direction of the back cover 110 and the length of the back cover 110 may be flexibly deformed. Therefore, the difference in lengths of the back cover 110 and the display panel 120 caused by the difference in radii of curvature during the process of winding the back cover 110 and the display panel 120 may be compensated by the plurality of openings 111 of the back cover 110. Further, the plurality of openings 111 is deformed during the process of winding the back cover 110 and the display panel 120 so that a stress which is applied to the display panel 120 from the back cover 110 may also be alleviated.

In the meantime, in the first support area PA1 and the second support area PA2, the plurality of openings 111 as formed in the malleable area MA is not formed. That is, in the first support area PA1 and the second support area PA2, only the first fastening holes AH1 and the second fastening holes AH2 are formed, but the plurality of openings 111 as formed in the malleable area MA is not formed. Further, the first fastening holes AH1 and the second fastening holes AH2 have different shapes from that of the plurality of openings 111. The first support area PA1 and the second support area PA2 which are fixed to the head bar 162 and the roller 151, respectively, need to be more rigid than the malleable area MA. Specifically, as the first support area PA1 and the second support area PA2 have the rigidity, the first support area PA1 and the second support area PA2 may be firmly fixed to the head bar 162 and the roller 151. Therefore, the display part DP is fixed to the roller 151 and the head bar 162 of the moving part MP to be moved to the inside or the outside of the housing part HP in accordance with the operation of the moving part MP.

In the display device 100 according to an exemplary embodiment of the present disclosure, the back cover 110 with the plurality of openings 111 formed therein is disposed on the rear surface of the display panel 120 to support and protect the display panel 120. The back cover 110 is formed of a metal material to have a rigidity. Simultaneously, in the malleable area MA where the display panel 120 and the back cover 110 is disposed, the plurality of openings 111 is formed so that the flexibility of the back cover 110 may be improved. Therefore, in a fully unwound state in which the display part DP of the display device 100 is disposed at the outside of the housing part HP, the back cover 110 which has a high rigidity may support the display panel 120 to be flatly spread. In contrast, in a fully wound state in which the display part DP of the display device 100 is accommodated in the housing part HP, the back cover 110 having a high flexibility due to the plurality of openings 111 is wound around the roller 151 together with the display panel 120 to be accommodated.

The malleable area MA of the back cover 110 includes a first malleable area MA1 between the first support area PA1 and the fixing area FA and a second malleable area MA2 between the fixing area FA and the second support area PA2.

The first malleable area MA1 is an area extending from the fixing area FA to an upper side of the back cover 110. The first malleable area MA1 is an area in which a plurality of openings is disposed and the display panel 120 is attached.

The second malleable area MA2 is an area extending from the fixing area FA to a lower side of the back cover 110. In the second malleable area MA2, a plurality of openings 111 is disposed, but the display panel 120 is not disposed.

The second malleable area MA2 extends to dispose the display area AA of the display panel 120 at the outside of the housing part HP. For example, when the back cover 110 and the display panel 120 are fully unwound, the second support area PA2 of the back cover 110 which is fixed to the roller 151 to the fixing area FA to which the flexible film 130 and the printed circuit board 135 are attached may be disposed in the housing part HP and the first malleable area MA1 and the first support area PA1 to which the display panel 120 is attached may be disposed at the outside of the housing part HP. In this case, when a length from the second support area PA2 fixed to the roller 151 to the second malleable area MA2 and the fixing area FA is smaller than a length from the second support area PA2 to the opening HPO of the housing part HP, a part of the first malleable area MA1 to which the display panel 120 is attached may be disposed in the housing part HP. Therefore, since a part of the lower end of the display area AA of the display panel 120 is disposed in the housing part HP, it may be difficult to watch images. Therefore, the length from the second support area PA2 fixed to the roller 151 to the second malleable area MA2 and the fixing area FA may be designed to be equal to the length from the second support area PA2 fixed to the roller 151 to the opening HPO of the housing part HP.

The display panel 120 is a panel for displaying images to a user. The display panel 120 may include a display element which displays images, a driving element which drives the display element, and wiring lines which transmit various signals to the display element and the driving element.

The display element may be defined in different ways depending on a type of the display panel 120. For example, when the display panel 120 is an organic light emitting display panel, the display element may be an organic light emitting diode which includes an anode, an organic light emitting layer, and a cathode. For example, when the display panel 120 is a liquid crystal display panel, the display element may be a liquid crystal display element. When the display panel 120 is a light emitting display panel including an LED, the display element may be an LED. Hereinafter, even though the display panel 120 is assumed as an organic light emitting display panel, the display panel 120 is not limited to the organic light emitting display panel. Further, since the display device 100 according to the exemplary embodiment of the present disclosure is a rollable display device, the display panel 120 may be implemented as a flexible display panel to be wound around or unwound from the roller 151.

Referring to FIGS. 4 and 5, the display panel 120 includes a display area AA and a non-display area NA.

The display area AA is an area where images are displayed in the display panel 120. In the display area AA, a plurality of sub pixels which configures the plurality of pixels and a driving circuit for driving the plurality of sub pixels may be disposed. The plurality of sub pixels is minimum units which configure the display area AA and a display element may be disposed in each of the plurality of sub pixels. For example, an organic light emitting diode which includes an anode, an organic light emitting layer, and a cathode may be disposed in each of the plurality of sub pixels, but it is not limited thereto. Further, a circuit for driving the plurality of sub pixels may include a driving element and a wiring line. For example, the circuit may be configured by a thin film transistor, a storage capacitor, a gate line, and a data line, but is not limited thereto.

The non-display area NA is an area where no image is displayed. The non-display area NA is disposed so as to enclose an outer periphery of the display area AA. In the non-display area NA, various wiring lines and circuits for driving the organic light emitting diode of the display area AA are disposed. For example, in the non-display area NA, a link line which transmits signals to the plurality of sub pixels and circuits of the display area AA or a driving IC such as a gate driver or a data driver may be disposed, but the non-display area is not limited thereto.

More specifically, in at least one of non-display areas NA at both side portions of the display area AA, a driving part for driving the display area AA, such as a gate driver, and various signal lines connected to the driving part may be disposed. The gate driver may be mounted in the non-display area NA at least one side of both sides of the display area AA in a gate in panel (GIP) manner. That is, the gate driver may be disposed on both side portions of the display area AA or only on at least one of both side portions of the display area AA.

In the meantime, when the display panel 120 is fully wound around the roller 151, a lowermost end of the non-display area NA of both side portions of the display panel 120 may be gently wound by the buffer member 140. Therefore, the cracks of components disposed in the non-display area NA may be suppressed. A detailed description thereof will be made below with reference to FIGS. 8A and 8B.

The flexible film 130 is a film in which various components are disposed on a base film having a malleability. The flexible film 130 supplies a signal to the plurality of sub pixels and the circuits of the display area AA and is electrically connected to the display panel 120. The flexible film 130 is disposed at one end of the non-display area NA of the display panel 120 to supply a power voltage or a data voltage to the plurality of sub pixels and the circuits of the display area AA. The number of flexible films 130 illustrated in FIG. 5 is illustrative and the number of flexible films 130 may vary depending on the design, but is not limited thereto.

In the meantime, for example, a driving IC such as a gate driver IC or a data driver IC may also be disposed on the flexible film 130. The driving IC is a component which processes data for displaying images and a driving signal for processing the data. The driving IC may be disposed by a chip on glass (COG), a chip on film (COF), or a tape carrier package (TCP) technique depending on a mounting method. However, for the convenience of description, it is described that the driving IC is mounted on the flexible film 130 by a chip on film technique, but is not limited thereto.

Referring to FIGS. 4 and 5, the printed circuit board 135 is disposed at one end of the flexible film 130 to be connected to the flexible film 130. The printed circuit board 135 is a component which supplies signals to the driving IC. The printed circuit board 135 supplies various signals such as a driving signal or a data signal to the driving IC. Various components may be disposed on the printed circuit board 135. For example, a timing controller and a power source unit may be disposed on the printed circuit board 135. Even though two printed circuit boards 135 are illustrated in FIG. 4, the number of printed circuit boards 135 may vary depending on the design and is not limited thereto.

In the meantime, even though not illustrated in FIG. 4, an additional printed circuit board which is connected to the printed circuit board 135 may be further disposed. For example, the printed circuit board 135 may be referred to as a source printed circuit board S-PCB on which the data driver is mounted and the additional printed circuit board connected to the printed circuit board 135 may be referred to as a control printed circuit board C-PCB in which the timing controller is mounted. The additional printed circuit board may be disposed in the roller 151 or disposed in the housing part HP at the outside of the roller 151.

Referring to FIG. 4, the buffer member 140 is disposed on a partial area of the back cover 110. Specifically, the buffer member 140 is disposed to cover the second support area PA2 of the back cover 110 and a part of the second malleable area MA2 adjacent to the second support area PA2. The buffer member 140 is disposed on a top surface of the back cover 110 to be located on the same plane as the display panel 120.

A horizontal width W1 of the buffer member 140 is smaller than a horizontal width W2 of the display panel 120.

Specifically, the horizontal width W1 of the buffer member 140 may be equal to or smaller than a horizontal width W3 of the display area AA of the display panel 120. Accordingly, in a column direction, the buffer member 140 is disposed so as to correspond only to the display area AA of the display panel 120, but not to correspond to the non-display areas NA on both side portions of the display panel 120. That is, when the display panel 120 is wound around the roller 151, the display area AA of the display panel 120 may overlap the buffer member 140, but the non-display areas NA on both side portions of the display panel 120 do not overlap the buffer member 140.

The buffer member 140 may allow the lowermost end of the non-display areas NA on both side portions of the display panel 120 adjacent to the fixing area FA to be wound with a larger radius of curvature as compared with a case that the buffer member 140 is not disposed. Therefore, the non-display areas NA on both side portions of the display panel 120 are gently wound to suppress the cracks of the driving elements disposed in the non-display areas NA on both side portions of the display panel 120. A detailed description thereof will be made below with reference to FIGS. 8A and 8B.

A thickness of the buffer member 140 may be 1.5 to 2.5 mm. If the thickness of the buffer member 140 is smaller than 1.5 mm, a radius of curvature of the display panel 120 wound on the buffer member 140 is small, which may cause the crack in a lower end of the display panel 120. When the thickness of the buffer member 140 is 2.5 mm or larger, it is undesirable because the thickness of the display device 100 is unnecessarily increased.

The buffer member 140 has a low modulus to serve as a cushion between components disposed on a top surface and a bottom surface of the buffer member 140. Therefore, impacts applied to the display panel 120 disposed on the buffer member 140 may be alleviated. The buffer member 140 may be formed of a foam tape, but is not limited thereto and may be formed of one of arbitrary insulating materials.

Referring to FIG. 5, the display panel 120 includes a substrate 121, a buffer layer 122, a pixel unit 123, an encapsulating layer 124, and an encapsulating substrate 125.

The substrate 121 which is a base member for supporting various components of the display panel 120 may be configured by an insulating material. The substrate 121 may be formed of a material having a flexibility to allow the display panel 120 to be wound or unwound and for example, may be formed of a plastic material such as polyimide PI.

The buffer layer 122 suppresses moisture and/or oxygen which is permeated from the outside of the substrate 121 from being spread. The buffer layer 122 may be configured by a single layer or a double layer of silicon oxide SiOx and silicon nitride SiNx, but is not limited thereto.

The pixel unit 123 includes a plurality of organic light emitting diodes and a circuit for driving the organic light emitting diodes. The pixel unit 123 may be an area corresponding to the display area AA. The organic light emitting diode may include an anode, an organic light emitting layer, and a cathode.

The anode may supply holes to the organic light emitting layer and be formed of a conductive material having a high work function. For example, the anode may be formed of tin oxide (TO), indium tin oxide (ITO), indium zinc oxide (IZO), or indium zinc tin oxide (ITZO), but is not limited thereto.

The organic light emitting layer is supplied with holes from the anode and supplied with electrons from the cathode to emit light. The organic light emitting layer may be formed of a red organic light emitting layer, a green organic light emitting layer, a blue organic light emitting layer, and a white organic light emitting layer depending on a color of light emitted from the organic light emitting layer. In this case, when the organic light emitting layer is a white organic light emitting layer, color filters having various colors may be additionally disposed.

The cathode may supply electrons to the organic light emitting layer and be formed of a conductive material having a low work function. For example, the cathode may be formed of any one or more selected from a group consisting of metals such as magnesium (Mg), silver (Ag), and aluminum (Al), and an alloy thereof, but is not limited thereto.

In the meantime, the display panel 120 may be configured by a top emission type or a bottom emission type, depending on an emission direction of light which is emitted from the organic light emitting diode.

According to the top emission type, light emitted from the organic light emitting diode is emitted to an upper portion of the substrate 121 on which the organic light emitting diode is formed. In the case of the top emission type, a reflective layer may be formed below the anode to allow the light emitted from the organic light emitting diode to travel to the upper portion of the substrate 121, that is, toward the cathode.

According to the bottom emission type, light emitted from the organic light emitting diode is emitted to a lower portion of the substrate 121 on which the organic light emitting diode is formed. In the case of the bottom emission type, the anode may be formed only of a transparent conductive material to allow the light emitted from the organic light emitting diode to travel to the lower portion of the substrate 121 and the cathode may be formed of the metal material having a high reflectance.

Hereinafter, for the convenience of description, the description will be made by assuming that the display device 100 according to an exemplary embodiment of the present disclosure is a bottom emission type display device, but it is not limited thereto.

A circuit for driving the organic light emitting diode is disposed in the pixel unit 123. The circuit may be formed of a thin film transistor, a storage capacitor, a gate line, a data line, and a power line, but it may vary in various forms depending on the design of the display device 100.

The encapsulating layer 124 which covers the pixel unit 123 is disposed on the pixel unit 123. The encapsulating layer 124 seals the organic light emitting diode of the pixel unit 123. The encapsulating layer 124 may protect the organic light emitting diode of the pixel unit 123 from moisture, oxygen, and impacts of the outside. The encapsulating layer 124 may be formed by alternately laminating a plurality of inorganic layers and a plurality of organic layers. For example, the inorganic layer may be formed of an inorganic material such as silicon nitride SiNx, silicon oxide SiOx, and aluminum oxide AlOx and the organic layer may be formed of epoxy-based or acrylic-based polymer, but they are not limited thereto.

The encapsulating substrate 125 is disposed on the encapsulating layer 124. The encapsulating substrate 125 protects the organic light emitting diode of the pixel unit 123 together with the encapsulating layer 124. The encapsulating substrate 125 may protect the organic light emitting diode of the pixel unit 123 from moisture, oxygen, and impacts of the outside. The encapsulating substrate 125 may be formed of a metal material, which has a high corrosion resistance and is easily processed in the form of a foil or a thin film, such as aluminum (Al), nickel (Ni), chromium (Cr), and an alloy material of iron (Fe) and nickel. Therefore, as the encapsulating substrate 125 is formed of a metal material, the encapsulating substrate 125 may be implemented as an ultra-thin film and provide a strong resistance against external impacts and scratches.

A first adhesive layer AD1 may be disposed between the encapsulation layer 124 and the encapsulation substrate 125. The first adhesive layer AD1 may bond the encapsulating layer 124 and the encapsulating substrate 125 to each other. The first adhesive layer AD1 is formed of a material having adhesiveness and may be a thermosetting or natural curable type adhesive. For example, the first adhesive layer AD1 may be formed of an optical clear adhesive (OCA) or a pressure sensitive adhesive (PSA), but is not limited thereto.

In the meantime, the first adhesive layer AD1 may be disposed to enclose the encapsulating layer 124 and the pixel unit 123. That is, the pixel unit 123 may be sealed by the buffer layer 122 and the encapsulating layer 124 and the encapsulating layer 124 and the pixel unit 123 may be sealed by the buffer layer 122 and the first adhesive layer AD1. The first adhesive layer AD1 may protect the organic light emitting diode of the pixel unit 123 from moisture, oxygen, and impacts of the outside together with the encapsulating layer 124 and the encapsulating substrate 125. In this case, the first adhesive layer AD1 may further include an absorbent. The absorbent may be particles having hygroscopicity and absorb moisture and oxygen from the outside to minimize permeation of the moisture and oxygen into the pixel unit 123.

The back cover 110 is disposed on the encapsulating substrate 125. The back cover 110 is disposed to be in contact with the encapsulating substrate 125 of the display panel 120 to protect the display panel 120. In order to protect the display panel 120, the back cover 110 may be formed of a material having a rigidity.

A second adhesive layer AD2 is disposed between the encapsulating substrate 125 and the back cover 110. The second adhesive layer AD2 may bond the encapsulating substrate 125 and the back cover 110 to each other. The second adhesive layer AD2 is formed of a material having adhesiveness and may be a thermosetting or natural curing adhesive. For example, the second adhesive layer AD2 may be formed of an optical clear adhesive (OCA) or a pressure sensitive adhesive (PSA), but is not limited thereto.

Even though in FIG. 5, it is illustrated that the plurality of openings 111 of the back cover 110 is not filled with the second adhesive layer AD2, the second adhesive layer AD2 may be filled in some or all of the plurality of openings 111 of the back cover 110. If the second adhesive layer AD2 is filled inside the plurality of openings 111 of the back cover 110, a contact area between the second adhesive layer AD2 and the back cover 110 is increased so that a separation phenomenon may be avoided.

In the meantime, even though not illustrated in FIG. 5, a light-transmissive film may be further disposed on a front surface of the substrate 121. The light-transmissive film may perform a function of protecting a front surface of the display panel 120 or minimizing the reflection of external light incident onto the display panel 120. For example, the light-transmissive film may be at least one of polyethyleneterephthalate (PET) film, an anti-reflection film, a polarizer film, and a transmittance controllable film, but is not limited thereto.

<Fastening Structure of Base Plate and Top Cover>

Figure 6:
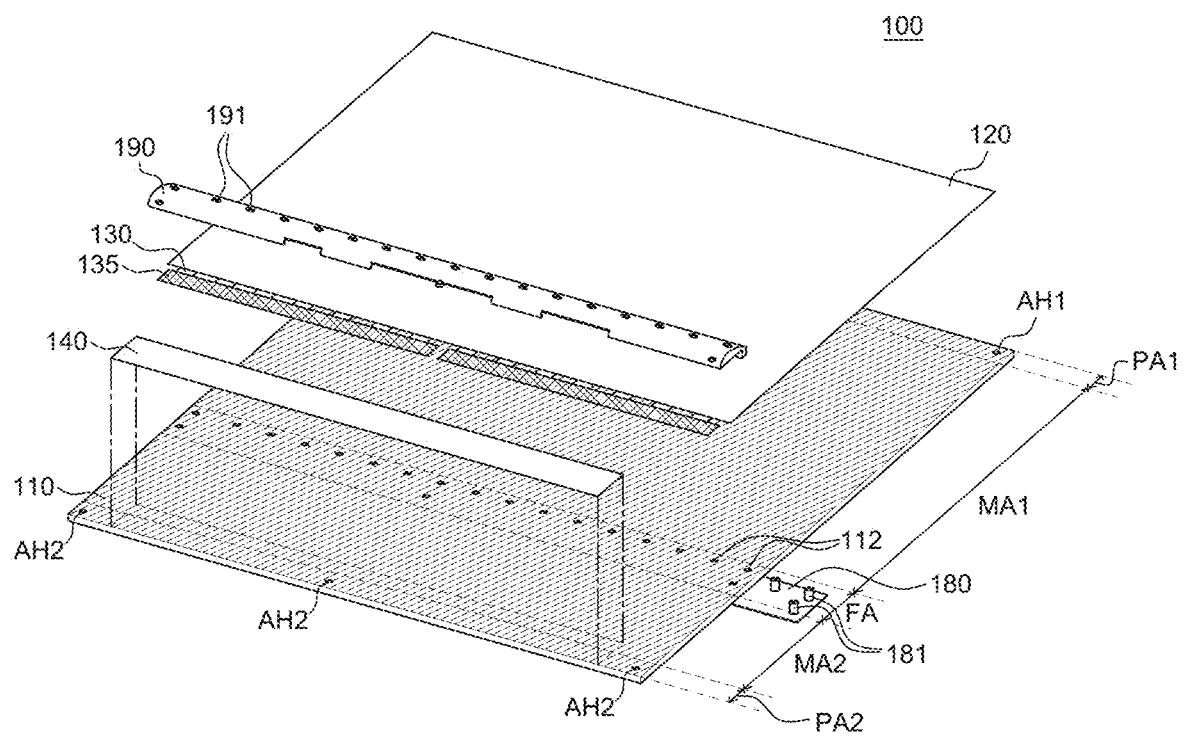
FIG. 6 is an exploded perspective view of a display device according to an exemplary embodiment of the present disclosure.

FIG. 6 is an exploded perspective view of a display device according to an exemplary embodiment of the present disclosure. In FIG. 6, a back cover 110 is schematically illustrated for the convenience of illustration. Referring to FIG. 6, the display device 100 further includes a base plate 180 and a top cover 190.

The base plate 180 is disposed on a part of one surface of the back cover 110 to support the back cover 110. The top cover 190 is disposed on a part of the other surface of the back cover 110 to allow the back cover 110 to be interposed between the top cover 190 and the base plate 180. Specifically, the base plate 180 is disposed on a rear surface of the back cover 110 to support the back cover 110 and the top cover 190 is disposed above the back cover 110 to be fastened with the base plate 180 to fix the back cover 110. The back cover 110, the flexile film 130, and the printed circuit board 135 are disposed between the base plate 180 and the top cover 190.

The base plate 180 is disposed on a rear surface of the fixing area FA of the back cover 110. The base plate 180 is fastened with the top cover 190 so that the flexible film 130 and the printed circuit board 135 disposed on the back cover 110 do not mechanically move. When the base plate 180 is formed of a conductive material, the base plate 180 may interfere with the flexible film 130 and the printed circuit board 135. Accordingly, the base plate 180 may be formed of an insulating material, but is not limited thereto.

The base plate 180 includes a plurality of fixing protrusions 181 which protrudes toward the top cover 190. The plurality of fixing protrusions 181 corresponds to the plurality of fixing holes 112 of the fixing area FA of the back cover 110. That is, the plurality of fixing protrusions 181 is disposed to pass through the plurality of fixing holes 112 of the fixing area FA of the back cover 110 to suppress the rocking of the back cover 110 in a final structure. Further, the plurality of fixing protrusions 181 is disposed to pass between the plurality of flexible films 130 to stably fix the flexible film 130 to the back cover 110.

Figure 7A:
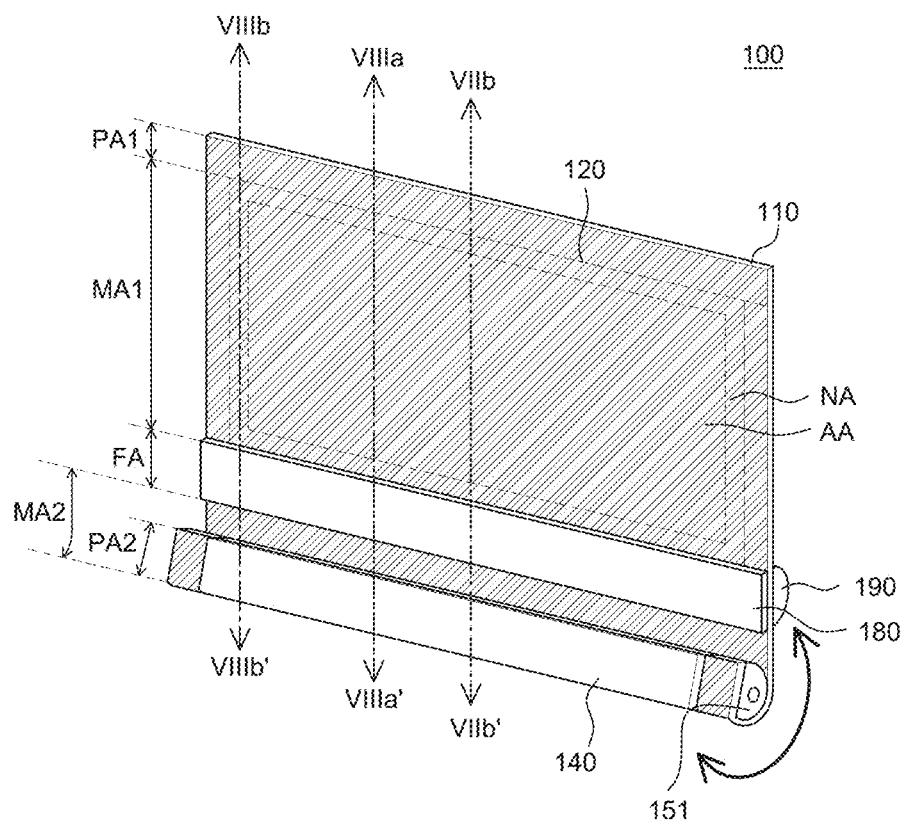
FIG. 7A is a perspective view for explaining a winding operation of a display device according to an exemplary embodiment of the present disclosure.
Figure 7B:
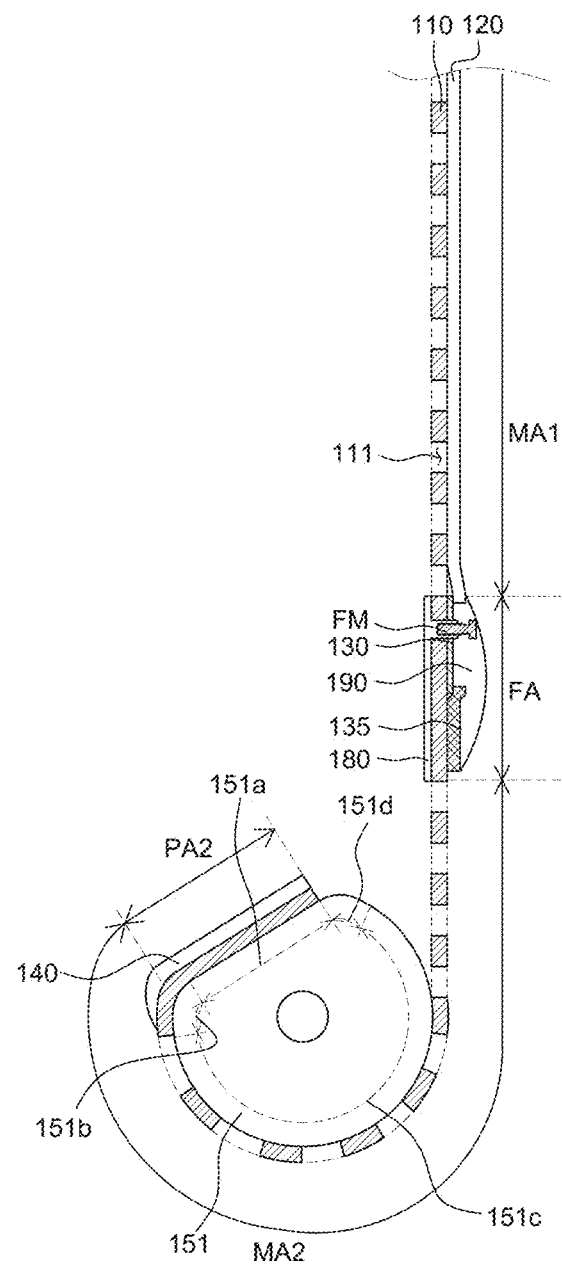
FIG. 7B is a cross-sectional view taken along the line VIIb-VIIb' of FIG. 7A.
Figure 8A:
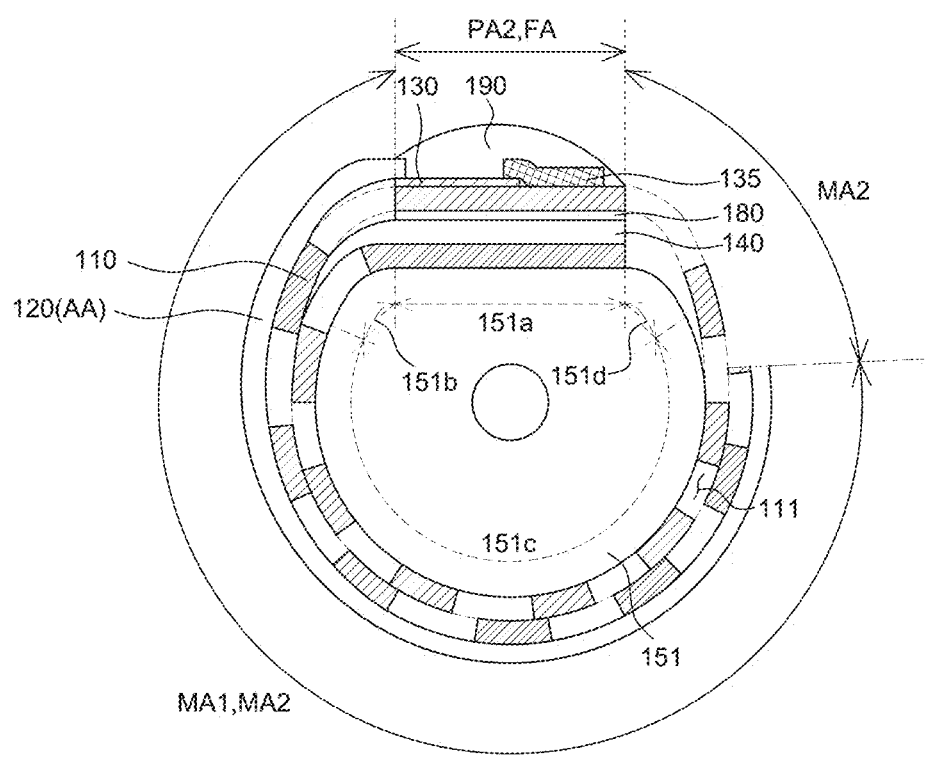
FIG. 8A is a cross-sectional view taken along the line VIIIa-VIIIa' of FIG. 7A.
Figure 8B:
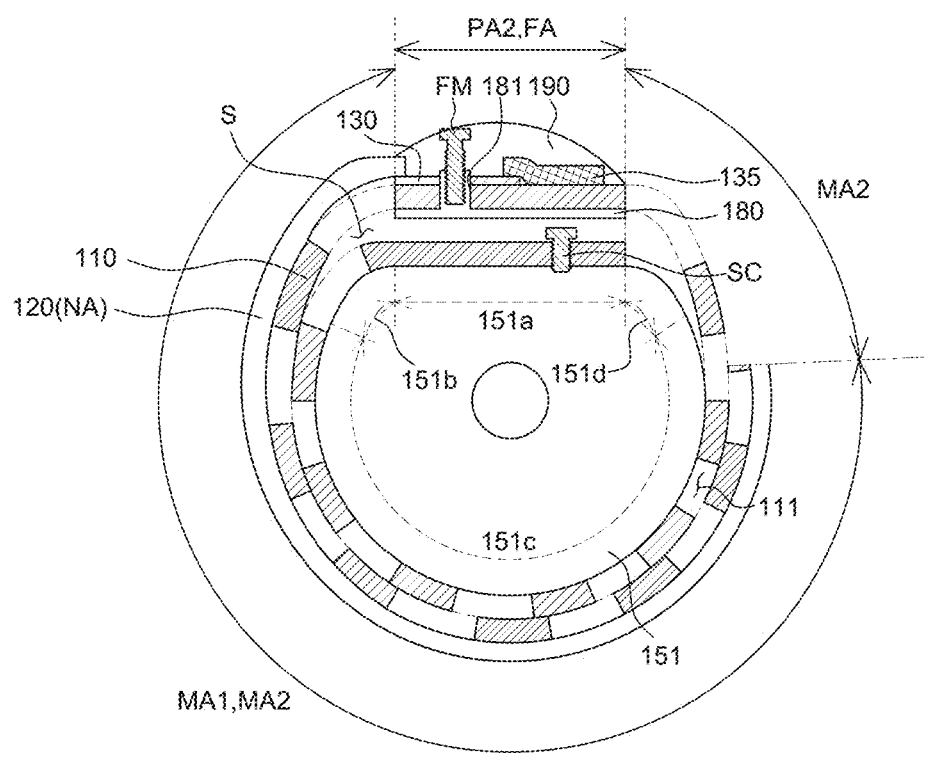
FIG. 8B is a cross-sectional view taken along the line VIIIb-VIIIb' of FIG. 7A.

In the plurality of fixing protrusions 181, a structure to which a plurality of fixing members FM illustrated in FIGS. 7B and 8B is fastened may be disposed. For example, the plurality of fixing protrusions 181 may be formed as a structure such as a pemnut, and for example, screw threads may be formed inside the plurality of fixing protrusions 181. Therefore, the plurality of fixing members FM may be fastened with the plurality of fixing protrusions 181 by the screw threads in the plurality of fixing protrusions 181.

The top cover 190 is disposed on the flexible film 130 and the printed circuit board 135 disposed in the fixing area FA of the back cover 110. The top cover 190 is disposed so as to cover the flexible film 130 and the printed circuit board 135. The top cover 190 may protect the flexible film 130 and the printed circuit board 135. When the top cover 190 is formed of a conductive material, the top cover 190 may interfere with the flexible film 130 and the printed circuit board 135. Accordingly, the top cover 190 may be formed of an insulating material, but is not limited thereto.

An outer circumferential surface of the top cover 190 is formed as a curved surface. Specifically, the top cove 190 is formed to have a curved outer circumferential surface to follow a rolled shape of the back cover 110. In this case, a radius of curvature of the curved surface of the top cover 190 may be equal to a radius of curvature of the roller 151. That is, when the display device 100 is wound, the top cover 190 is disposed on a flat surface of the roller 151. In other words, when the top cover 190 is disposed on the flat surface of the roller 151, the top cover 190 may be formed to have an outer circumferential surface having substantially the same radius of curvature as the roller 151 so that a shape thereof is substantially circular.

The top cover 190 includes a plurality of coupling holes 191 disposed in a position corresponding to the plurality of fixing holes 112 of the fixing area FA of the back cover 110. Therefore, the plurality of fixing members FM passes through the plurality of coupling holes 191 and the plurality of fixing protrusions 181 so that the base plate 180 and the top cover 190 may be fastened with each other.

The plurality of fixing members FM is fastened with the plurality of fixing protrusions 181 to fix the base plate 180, the back cover 110, and the top cover 190. Specifically, the plurality of fixing members FM may be disposed so as to pass through the plurality of coupling holes 191 of the top cover 190. Each of the plurality of fixing members FM which passes through the plurality of coupling holes 191 of the top cover 190 may be fastened with respective one of the plurality of fixing protrusions 181 of the base plate 180. Accordingly, the plurality of fixing members FM is fastened with the plurality of fixing protrusions 181 so that the base plate 180, the back cover 110, and the top cover 190 are fastened with each other to be fixed. For example, the plurality of fixing members FM may be screws or bolts, but is not limited thereto.

<Winding of Back Cover and Display Panel>

FIG. 7A is a perspective view for explaining a winding operation of a display device according to an exemplary embodiment of the present disclosure. FIG. 7B is a cross-sectional view taken along the line VIIb-VIIb' of FIG. 7A. Specifically, FIG. 7A is a perspective view seen from a rear surface of the display device 100. In FIGS. 7A and 7B, it is illustrated that a part of the second malleable area MA2 of the back cover 110 is wound around the roller 151. In FIG. 7A, a back cover 110 is schematically illustrated for the convenience of illustration.

Referring to FIGS. 7A and 7B, the second support area PA2 of the back cover 110 is fixed to the roller 151 and a part of the second malleable area MA2 is wound around the roller 151.

The roller 151 includes a flat surface 151a and curved surfaces 151b, 151c, and 151d. Further, the curved surfaces 151b, 151c, and 151d may include a first curved surface 151b, a second curved surface 151c, and a third curved surface 151d. The first curved surface 151b and the third curved surface 151d extend from one end and the other end of the flat surface 151a, respectively. The second curved surface 151c connects the first curved surface 151b and the third curved surface 151d. In this case, radii of curvature of the first curved surface 151b and the third curved surface 151d are smaller than a radius of curvature of the second curved surface 151c. That is, the first curved surface 151b and the third curved surface 151d connect the flat surface 151a and the second curved surface 151c so that radii of curvature of the first curved surface 151b and the third curved surface 151d may be smaller than a radius of curvature of the second curved surface 151c. In the meantime, the first curved surface 151b and the third curved surface 151d may have the same radius of curvature, but are not limited thereto and a radius of curvature of the first curved surface 151b may be smaller than the radius of curvature of the third curved surface 151d.

The second support area PA2 is fastened with the flat surface 151a of the roller 151. Further, on a partial area of the first curved surface 151b and the second curved surface 151c of the roller 151, a part of the second malleable area MA2 extending from the second support area PA2 is disposed. In this case, the buffer member 140 is disposed on the second support area PA2 and the part of the second malleable area MA2 of the back cover 110. Accordingly, the buffer member 140 is also disposed on a partial area of the roller 151 together with the second support area PA2 and the second malleable area MA2. Specifically, the buffer member 140 is disposed so as to correspond to the flat surface 151a and the first curved surface 151b of the roller 151.

Except for the second support area PA2 and the part of the second malleable area MA2 wound around the roller 151, the remaining area of the second malleable area MA2 and the remaining area of the back cover 110 extending from the second malleable area MA2 may be flat. That is, the remaining area of the second malleable area MA2, the fixing area FA, the first malleable area MA1, and the first support area PA1 may be flat. In this case, the base plate 180 is disposed on the rear surface of the fixing area FA and the top cover 190 is disposed on the flexible film 130 and the printed circuit board 135 disposed on the top surface.

Thereafter, when the winding operation is further performed, the remaining part of the second malleable area MA2 is disposed on the remaining area of the second curved surface 151c and the third curved surface 151d of the roller 151. Further, the fixing area FA of the back cover 110 is disposed on the flat surface 151a of the roller 151. Specifically, the fixing area FA is disposed on the second support area PA2 and the buffer member 140 disposed on the flat surface 151a of the roller 151. Further, the first malleable area MA1 extending from the fixing area FA may be wound along an outer circumferential surface of the second malleable area MA2 wound around the curved surfaces 151b, 151c, and 151d of the roller 151 and an outer circumferential surface of the top cover 190 disposed in the second malleable area MA2 wound around the curved surfaces 151b, 151c, and 151d of the roller 151 and the fixing area FA wound on the flat surface 151a.

The flexible film 130 and the printed circuit board 135 disposed in the fixing area FA are disposed on the flat surface 151a of the roller 151 so that the flexible film 130 and the printed circuit board 135 may be maintained to be flat without being curved. Therefore, the flexible film 130 and the printed circuit board 135 always maintain a flat state regardless of the winding or unwinding of the display part DP and the damage caused when the flexible film 130 and the printed circuit board 135 are bent may be suppressed.

A top cover 190 having a convex curved shape is disposed on a top surface of the fixing area FA. The first malleable area MA1 which is wound so as to cover the top cover 190 of the fixing area FA may be curved in accordance with the shape of the top cover 190. In this case, the curved shape of the top cover may have a shape corresponding to the roller 151. Accordingly, the first malleable area MA1 may be wound around the roller 151 to have a cross section which is substantially a circular shape.

<Winding Structure of Display Area and Non-Display Area of Display Panel>

FIG. 8A is a cross-sectional view taken along the line VIIIa-VIIIa' of FIG. 7A. FIG. 8B is a cross-sectional view taken along the line VIIIb-VIIIb' of FIG. 7A. Specifically, FIG. 8A is a cross-sectional view of an area corresponding to a display area AA at a center portion of the display panel 120 and FIG. 8B is a cross-sectional view corresponding to non-display areas NA on both side portions of the display panel 120 which do not correspond to the buffer member 140. That is, FIG. 8A is a cross-sectional view of a display device 100 corresponding to a center portion of the roller 151 and FIG. 8B is a cross-sectional view of a display device 100 corresponding to both ends of the roller 151. In FIGS. 8A and 8B, for the convenience of description, it is illustrated that a part of the first malleable area MA1 extending from the fixing area FA is wound around the roller 151. Further, in FIGS. 8A and 8B, it is illustrated that an end of the buffer member 140 disposed on the curved surface of the roller 151 is thinner than the other area of the buffer member 140, but is not limited thereto.

Referring to FIG. 8A, the second malleable area MA2, the fixing area FA, and the first malleable area MA1 of the back cover 110 are sequentially wound around the roller 151. The buffer member 140 is disposed on the second support area PA2 and a part of the second malleable area MA2 adjacent to the second support area PA2. That is, the buffer member 140 is disposed on an area corresponding to the flat surface 151a of the roller 151 and the first curved surface 151b of the roller 151. Further, the base plate 180, the fixing area FA, the flexible film 130, the printed circuit board 135, and the top cover 190 are disposed on the buffer member 140 corresponding to the flat surface 151a of the roller 151. Further, the first malleable area MA1 extending from the fixing area FA and the display panel 120 are disposed on the buffer member 140 and the second malleable area MA2 corresponding to the first curved surface 151b of the roller 151.

On the first curved surface 151b of the roller 151, the second malleable area MA2 is spaced apart from the first malleable area MA1 by the buffer member 140. That is, the buffer member 140 allows the first malleable area MA1 to be wound around the roller 151 with a radius of curvature larger than a radius of curvature of the second malleable area MA2. Further, the buffer member 140 also allows a lower end of the display panel 120 disposed on the first curved surface 151b of the roller 151 to be wound around the roller 151 with a radius of curvature larger than a radius of curvature of the second malleable area MA2.

Referring to FIG. 8B, the back cover 110 and the display panel 120 are wound around the roller 151 similarly to FIG. 8A. However, in the cross-sectional view of FIG. 8B, the buffer member 140 is not provided. That is, FIG. 8B is a cross-sectional view corresponding to both ends of the roller 151 so that the buffer member 140 which overlaps only the display area AA of the display panel 120 does not overlap the non-display area NA on both side portions of the display panel 120. However, the buffer member 140 is disposed in an area corresponding to the display area AA. Accordingly, the buffer member 140 which overlaps the display area AA allows the non-display area NA on both side portions of the display panel 120 disposed on the first curved surface 151b to be wound around the roller 151 with a radius of curvature larger than a radius of curvature of the second malleable area MA2, at both ends of the roller 151. Further, on the first curved surface 151b, there may be a space S between the non-display area NA on both side portions of the display panel 120 and the roller 151.

The first curved surface 151b of the roller 151 has a radius of curvature smaller than a radius of curvature of the second curved surface 151c of the roller 151. Further, on the first curved surface 151b of the roller 151, a slope of a straight line contacting an outer surface of the roller 151 may change sharply. Therefore, when the display part DP is wound, the display part DP is bent on the first curved surface 151b more than the flat surface 151a and the second curved surface 151c. That is, the display part DP is sharply bent on the first curved surface 151b of the roller 151.

In the meantime, even though the display part DP is disposed on the first curved surface 151b of the roller 151, the display part DP disposed on the outer circumferential surface of the top cover 190 may be gently bent. Specifically, when the top cover 190 is disposed on the flat surface 151a of the roller 151, a cross-section of the display part DP wound around the roller 151 may have a circular shape. Therefore, after disposing the top cover 190 on the flat surface 151a of the roller 151, the display part DP may be wound around the roller 151 with a gentle radius of curvature.

Therefore, the display part DP may be sharply bent in the second malleable area MA2 extending from the second support area PA2, the first malleable area MA1 extending from the fixing area FA, and at a lower end of the display panel 120 extending from the flexible film 130 to the maximum. That is, on the first curved surface 151b of the roller 151, a slope of a tangent line contacting an outer circumferential surface of the lower end of the display panel 120 may change sharply. Accordingly, the lower end of the display panel 120 is sharply bent so that the stress may be concentrated and the lower end may be cracked.

Specifically, the gate driver and the signal line for driving the display area AA may be disposed in the non-display area NA on at least one of both side portions of the display panel 120. Accordingly, the stress is concentrated onto the gate driver and the signal line disposed in the non-display area NA corresponding to both lower ends of the display panel 120 to be cracked. In this case, the gate driver and the signal line are damaged so that the display area AA may not be normally driven and a defect of the display panel 120 may be generated.

Therefore, the display device 100 according to the exemplary embodiment of the present disclosure includes the buffer member 140 so that the lower end of the display panel 120 may be gently bent on the first curved surface 151b of the roller 151. That is, the buffer member 140 is disposed so as to cover the second support area PA2 and a part of the second malleable area MA2 disposed on the flat surface 151a of the roller 151 and the first curved surface 151b of the roller 151. Therefore, as compared with a case that the buffer member 140 is not provided, the fixing area FA and the first malleable area MA1 disposed on the buffer member 140 may be bent to have a larger radius of curvature. Further, the lower end of the display panel 120 which is bent together with the first malleable area MA1 on the buffer member 140 may be bent to have a larger radius of curvature as compared with the case that the buffer member 140 is not provided.

Therefore, a stress which is applied to the lower end of the display panel 120 may be alleviated on the first curved surface 151b where a slope of the outer circumferential surface of the roller 151 sharply changes. Specifically, the stress applied to both lower ends of the display panel 120 is alleviated so that the crack of the driving part disposed on both side portions of the display panel 120 is suppressed and the reliability of the display panel 120 is improved.

In the meantime, as illustrated in FIG. 8B, both side lower ends of the display panel 120 may be spaced apart from the roller 151 with a space S therebetween. Here, the space S may be an empty space between the display panel 120 and the roller 151 on the first curved surface 151b of the roller 151. Further, the space S may be an empty space between the second support area PA2 and the second malleable area MA2 on the roller 151 and between the base plate 180 on the rear surface of the fixing area FA and the first malleable area MA1.

Specifically, the non-display area NA on both side lower ends of the display panel 120 does not overlap the buffer member 140. Therefore, the buffer member 140 is not disposed in an area corresponding to the non-display area NA and only the space S by the buffer member 140 is present. That is, the non-display area NA on both side lower ends of the display panel 120 is not in direct contact with the roller 151 or the second malleable area MA2 on the roller 151 but is spaced apart from the roller 151 with a space S therebetween to be wound around the roller 151. In other words, the non-display area NA on both side lower ends of the display panel 120 is wound around the roller 151 while being floated from the roller 151. Therefore, as compared with the non-display area NA on both side lower ends of the display panel 120 which is wound while being in direct contact with the roller 151, the stress applied to the non-display area NA may be minimized. Accordingly, the crack of the components disposed in the non-display area NA on both side lower ends of the display panel 120 may be more effectively suppressed.

In the meantime, even though the lower end of the display panel 120 is wound on the buffer member 140, the radius of curvature of the display panel 120 on the first curved surface 151*b* of the roller 151 may be still smaller than the radius of curvature of the display panel 120 on the second curved surface 151*c* of the roller 151. Further, as illustrated in FIG. 4, the non-display area NA may be provided also at a center lower end of the display panel 120 corresponding to a lower portion of the display area AA as well as both side lower ends of the display panel 120. In the non-display area NA at the center lower end of the display panel 120, a routing signal line which connects the display area AA and the flexible film 130 may be disposed. Accordingly, in the non-display area at the center lower end of the display panel 120 in which the routing signal line is disposed, the stress may be concentrated due to the small radius of curvature.

Therefore, the buffer member 140 of the display device 100 according to the exemplary embodiment of the present disclosure includes a buffer member 140 formed of a material having a cushion function. Further, as illustrated in FIG. 8A, the center lower end of the display panel 120 is wound on the buffer member 140 having a cushion function. Therefore, the stress applied to the center lower end of the display panel 120 which is wound on the buffer member 140 may be buffered. That is, the display panel 120 may be gently bent on the first curved surface 151*b* of the roller 151 while buffering the stress by the buffer member 140. Accordingly, the crack which may be caused on the routing signal line in the non-display area NA at the center lower end of the display panel 120 may be more effectively suppressed.

<Structure of Back Cover>

Figure 9:
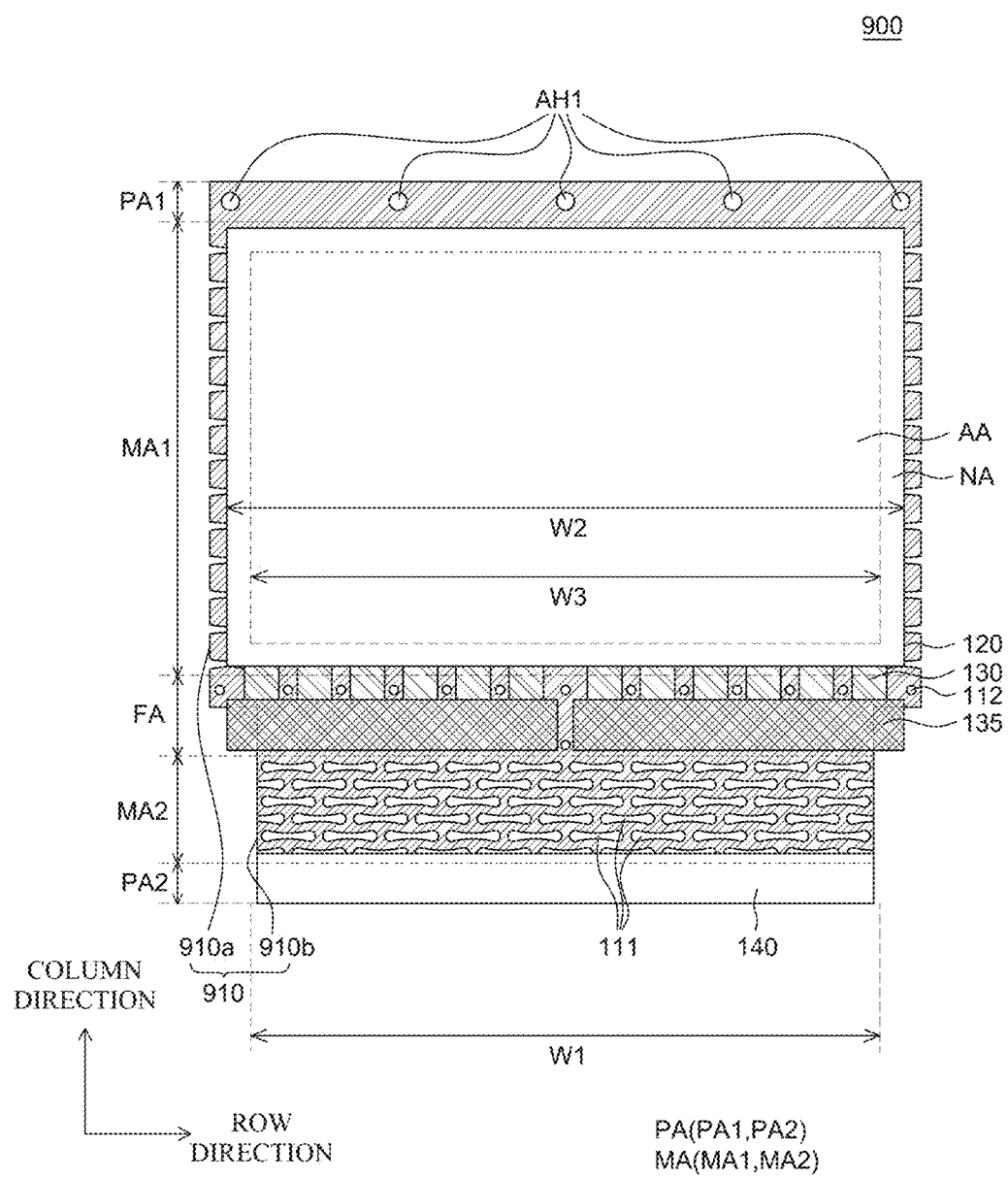
FIG. 9 is a plan view of a display part of a display device according to another exemplary embodiment of the present disclosure.
Figure 10:
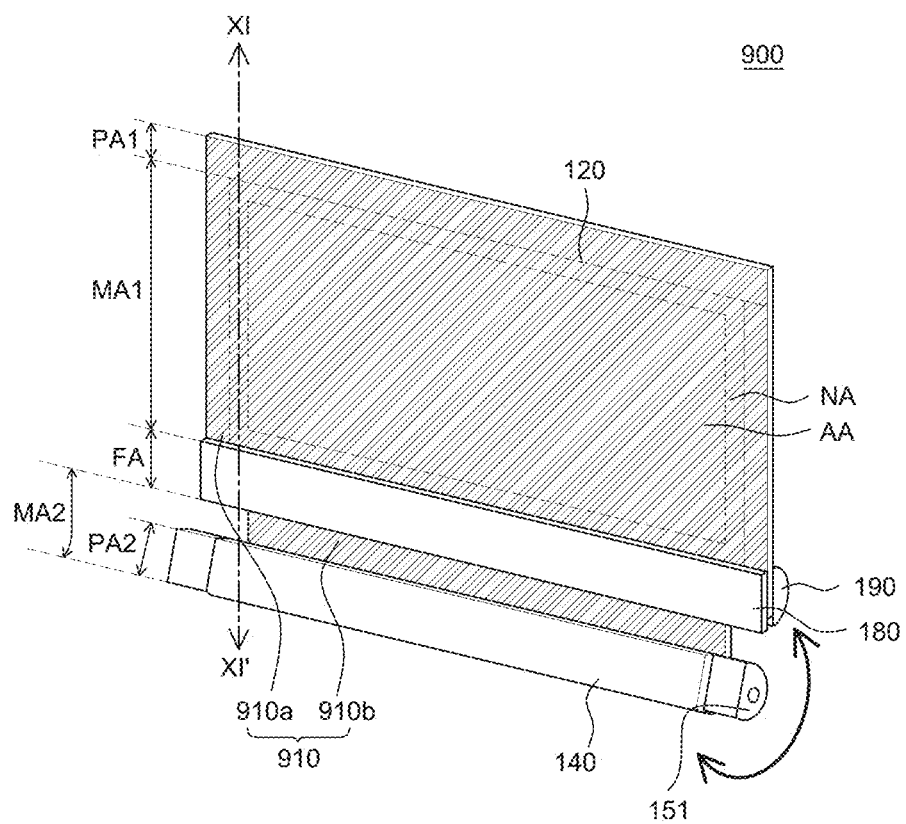
FIG. 10 is a perspective view for explaining a winding operation of a display device according to another exemplary embodiment of the present disclosure.
Figure 11:
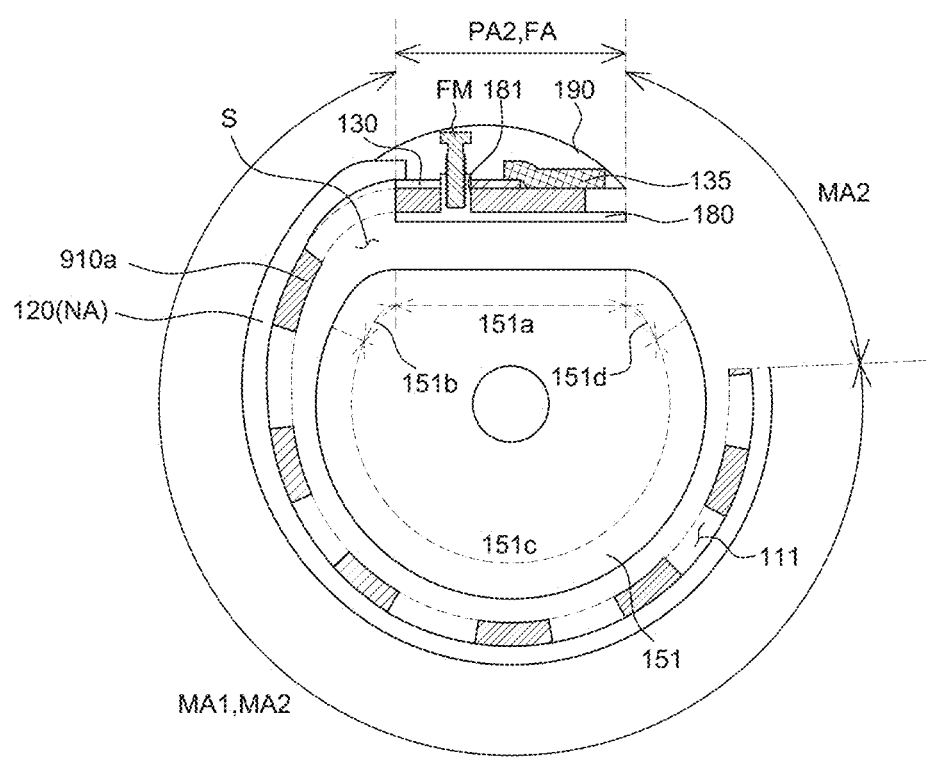
FIG. 11 is a cross-sectional view taken along the line XI-XI' of FIG. 10.

FIG. 9 is a plan view of a display part of a display device according to another exemplary embodiment of the present disclosure. FIG. 10 is a perspective view for explaining a winding operation of a display device according to another exemplary embodiment of the present disclosure. FIG. 11 is a cross-sectional view taken along the line XI-XI' of FIG. 10. Specifically, FIG. 10 is a perspective view seen from a rear surface side of a display device 900. In FIG. 10, it is illustrated that a part of a second malleable area MA2 of a back cover 910 is wound around the roller 151. FIG. 11 is a cross-sectional view corresponding to the non-display area NA on both side portions of the display panel 120 which does not correspond to the buffer member 140. That is, FIG. 11 is a cross-sectional view of the display device 900 corresponding to both ends of the roller 151. In FIG. 11, for the convenience of description, it is illustrated that a part of the first malleable area MA1 extending from the fixing area FA is wound around the roller 151. The display device 900 illustrated in FIGS. 9 to 11 is substantially the same as the display device 100 illustrated in FIGS. 1 to 8 except for a back cover 910, so that a redundant description will be omitted.

Referring to FIG. 9, the back cover 910 includes a first back cover 910*a* and a second back cover 910*b*. That is, the back cover 910 includes the first back cover 910*a* and the second back cover 910*b* having a width smaller than a width of the first back cover 910*a*. In this case, the first back cover 910*a* and the second back cover 910*b* may be integrally formed.

The first back cover 910*a* overlaps the display panel 120. The first back cover 910*a* includes a first support area PA1, a first malleable area MA1, and a part of a fixing area FA extending from the first malleable area MA1. In this case, the first support area PA1, the first malleable area MA1, and a part of the fixing area FA extending from the first malleable area MA1 of the first back cover 910*a* have the same width. That is, the first back cover 910*a* may be defined as areas having the same width in a row direction.

The second back cover 910*b* is fixed to the roller 151. The second back cover 910*b* has a horizontal width which is smaller than a horizontal width of the first back cover 910*a* and the display panel 120. The second back cover 910*b* includes a second support area PA2, a second malleable area MA2, and a part of a fixing area FA extending from the second malleable area MA2. In this case, the second support area PA2, the second malleable area MA2, and a part of the fixing area FA extending from the second malleable area MA2 of the second back cover 910*b* have the same width. That is, the second back cover 910*b* may be defined as areas having the same width in a row direction.

A buffer member 140 is disposed on a partial area of the second back cover 910*b*. In this case, a horizontal width W1 of the buffer member 140 may be equal to or smaller than a horizontal width W3 of the display area AA of the display panel 120. Further, the horizontal width W1 of the buffer member 140 may be equal to the horizontal width of the second back cover 910*b*.

A boundary of the first back cover 910*a* and the second back cover 910*b* may be located in the fixing area FA. That is, the width of the back cover 910 varies with respect to the fixing area FA so that the back cover 910 may be divided into the first back cover 910*a* and the second back cover 910*b*. In FIG. 9, it is illustrated that the boundary of the first back cover 910*a* and the second back cover 910*b* is located in the fixing area FA, but the boundary of the first back cover 910*a* and the second back cover 910*b* may be located as same as the boundary of the fixing area FA and the second malleable area MA2. That is, the first back cover 910*a* includes the first support area PA1, the first malleable area MA1, and the fixing area FA and the second back cover 910*b* includes the second malleable area MA2 and the second support area PA2. In other words, the boundary of the first back cover 910*a* and the second back cover 910*b* may be located in an arbitrary area where the width of the second malleable area MA2 and the second support area PA2 of the back cover 910 is smaller than a width of the remaining area of the back cover 910.

Referring to FIG. 10, the second support area PA2 of the back cover 910 is fixed to the roller 151 and a part of the second malleable area MA2 is wound around the roller. In this case, the buffer member 140 is disposed on the second support area PA2 and the part of the second malleable area MA2 of the back cover 910. That is, the buffer member 140 is disposed so as to correspond to the flat surface 151*a* of the roller 151 and the first curved surface 151*b* of the roller 151.

Thereafter, when the winding operation is further performed, the remaining of the second malleable area MA2 is wound around the roller 151. Further, the fixing area FA of the back cover 910 is disposed on the flat surface 151a of the roller 151. Further, the first malleable area MA1 extending from the fixing area FA may be wound along an outer circumferential surface of the top cover 190 disposed in the second malleable area MA2 wound around the curved surfaces 151b, 151c, and 151d of the roller 151 and the flat surface 151a.

The display device 900 according to another exemplary embodiment of the present disclosure includes the buffer member 140 so that the lower end of the display panel 120 may be gently bent on the first curved surface 151b of the roller 151. Therefore, a stress which is applied to the lower end of the display panel 120 corresponding to the first curved surface 151b of the roller 151 may be alleviated. That is, the crack of the driving part and the signal line disposed on both side lower portions of the display panel 120 may be suppressed. Further, the buffer member 140 has a cushion function so that the crack of the routing signal line at the center lower end of the display panel 120 wound on the buffer member 140 may be suppressed.

In the meantime, a width of the second back cover 910b is smaller than a width of the first back cover 910a. The width of the second back cover 910b may be equal to a width W1 of the buffer member 140. Accordingly, when the display part DP is fully wound around the roller 151, the second back cover 910b, the buffer member 140, the first back cover 910a, and the display area AA of the display panel 120 overlap each other. However, when the display part DP is fully wound around the roller 151, the second back cover 910b and the buffer member 140 do not overlap the non-display area NA of both side portions of the display panel 120.

Specifically, referring to FIG. 11, at both ends of the roller 151 where the non-display area NA on both side portions of the display panel 120 is disposed, the second back cover 910b and the buffer member 140 are not disposed. That is, the second back cover 910b and the buffer member 140 which overlap only the display area AA of the display panel 120 do not overlap the non-display area NA on both side portions of the display panel 120. However, the second back cover 910b and the buffer member 140 are disposed in an area corresponding to the display area AA. Further, on both ends of the roller 151, there may be a space S between the non-display area NA on both side portions of the display panel 120 disposed on the first curved surface 151b and the roller 151.

That is, the non-display area NA on both side portions of the display panel 120 may be spaced apart from the roller 151 with a space S therebetween. Here, the space S may be an empty space between the display panel 120 and the roller 151. Further, the space S may be an empty space between the roller 151 and the base plate 180 on the rear surface of the fixing area FA and the first malleable area MA1.

Specifically, the non-display area NA on both side portions of the display panel 120 does not overlap the second back cover 910b and the buffer member 140. Therefore, in an area corresponding to the non-display area NA on both side portions of the display panel 120, the second back cover 910b and the buffer member 140 are not disposed and only the space S by the second back cover 910b and the buffer member 140 is present. That is, the non-display area NA on both side portions of the display panel 120 is spaced apart from the roller 151 with the space S therebetween to be wound around the roller 151 without being in direct contact with the roller 151. In other words, the non-display area NA on both side portions of the display panel 120 is wound around the roller 151 while being floated from the roller 151. Therefore, as compared with the non-display area NA on both side portions of the display panel 120 which is wound while being in direct contact with the roller 151, the stress applied to the non-display area NA may be minimized.

The display device 900 according to another exemplary embodiment of the present disclosure may have a space S formed by the second back cover 910b and the buffer member 140. Therefore, as compared with the previous exemplary embodiment, the space S between the roller 151 and the both side portions of the display panel 120 may be increased. Specifically, in the previous exemplary embodiment, the second back cover 110b has a width overlapping the non-display area NA on both side portions of the display panel 120 so that only a space formed by the buffer member 140 is present between the non-display area NA on both side portions of the display panel 120 and the roller 151. However, according to another exemplary embodiment of the present disclosure, the second back cover 110b has a width overlapping only the display area AA of the display panel 120 so that there is a space S formed by the buffer member 140 and the second back cover 110b between the non-display area NA on both side portions of the display panel 120 and the roller 151.

Specifically, the display device 900 according to another exemplary embodiment of the present disclosure has a space S not only on the first curved surface 151b of the roller, but also on the second curved surface 151c and the third curved surface 151d of the roller 151. Specifically, when the back cover 910 is wound around the roller 151, after the second support area PA2 and the second malleable area MA2 are wound once around the roller 151, the fixing area FA and the first malleable area MA1 in which the display panel 120 is disposed are wound around the roller 151. In this case, the second support area PA2 and the second malleable area MA2 surrounding the roller 151 one turn have a width overlapping only the display area AA of the display panel 120. Therefore, the non-display area NA of both side portions of the display panel 120 does not overlap the second support area PA2 and the second malleable area MA2 of the second back cover 910b. Therefore, there may be a space S between the non-display area NA on both side portions of the display panel 120 and the roller 151 so as to surround the roller 151 one turn.

Therefore, as compared with the previous exemplary embodiment, in the display device 900 according to another exemplary embodiment of the present disclosure, the space S between the non-display area NA of both side portions of the display panel 120 and the roller 151 may be longer. Specifically, when the non-display area NA on both side portions of the display panel 120 is wound around the roller 151 one turn, there is a space S between the non-display area NA on both side portions of the display panel 120 and the roller 151. Therefore, the non-display area NA on both side portions of the display panel 120 is wound around the roller 151 once while being floated from the roller 151. That is, not only both side lower ends of the display panel 120 corresponding to the first curved surface 151b of the roller 151, but also both side portions of the display panel 120 corresponding to all the curved surfaces 151b, 151c, and 151d of the roller 151 may be wound around the roller 151 while being floated. Therefore, the stress which is applied to the entire non-display area NA of both side portions of the display panel 120 may be further minimized. That is, the crack caused in the components such as the driving part disposed in the non-display area NA on both side portions of the display panel 120 is suppressed so that the reliability of the display panel 120 may be improved.

Figure 12:
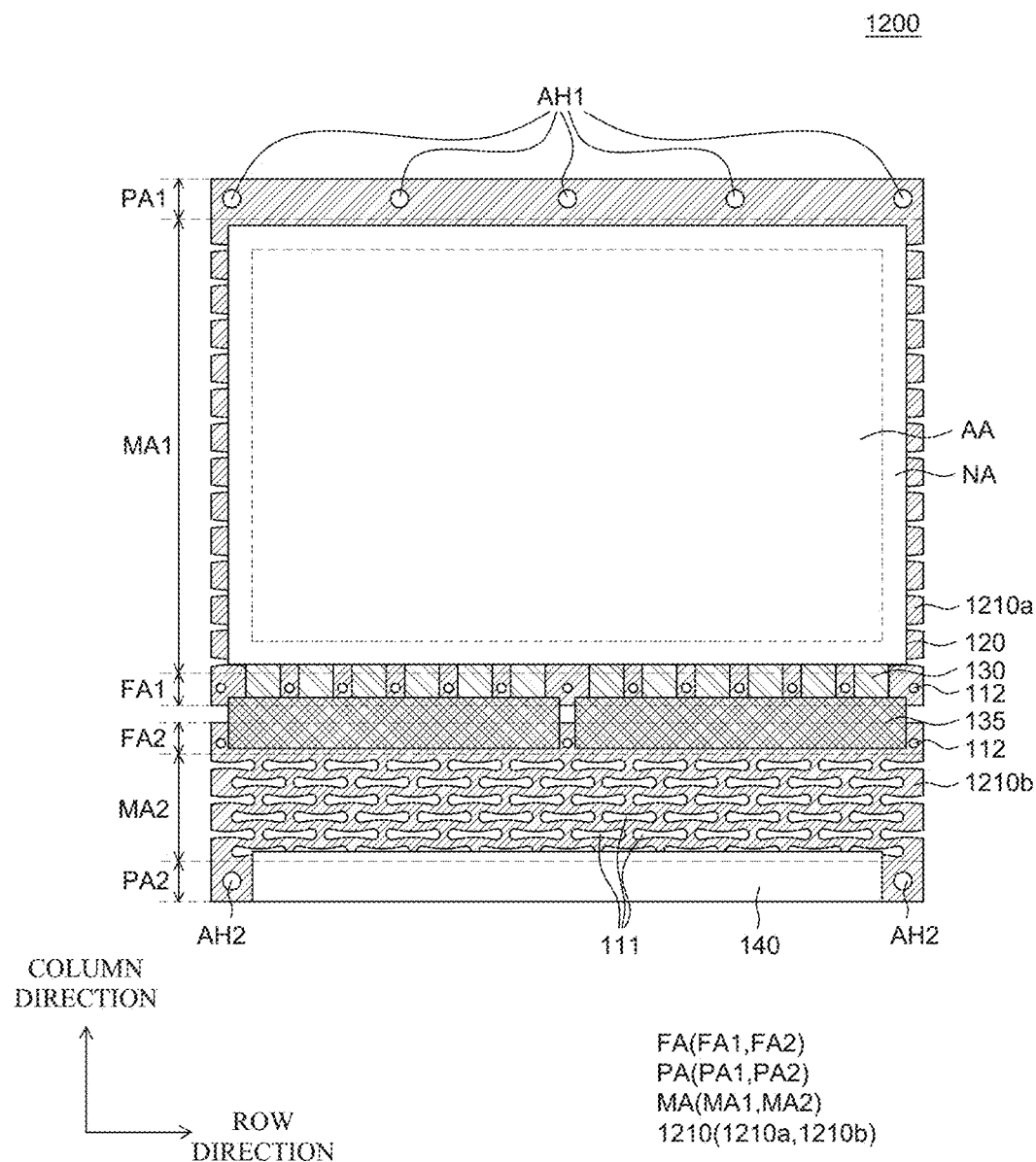
FIG. 12 is a plan view of a display part of a display device according to still another exemplary embodiment of the present disclosure.

FIG. 12 is a plan view of a display part of a display device according to still another exemplary embodiment of the present disclosure. In FIG. 12, for the convenience of description, only a display part DP of a display device 1200 is illustrated. The display device 1200 illustrated in FIG. 12 is substantially the same as the display device 100 illustrated in FIGS. 1 to 8 except for a back cover 1210, so that a redundant description will be omitted.

Referring to FIG. 12, the back cover 1210 includes a first back cover 1210*a* and a second back cover 1210*b*. In this case, the first back cover 1210*a* and the second back cover 1210*b* may be formed to be separated.

The first back cover 1210*a* overlaps the display panel 120. The second back cover 1210*b* is disposed to be fixed to the roller 151. The first back cover 1210*a* and the second back cover 1210*b* are disposed to be spaced apart from each other. A space is disposed between the first back cover 1210*a* and the second back cover 1210*b*. The first back cover 1210*a* and the second back cover 1210*b* may be connected by the base plate 180 and the top cover 190.

Each of the first back cover 1210*a* and the second back cover 1210*b* includes a malleable area MA, and a support area PA and a fixing area FA which extend from the malleable area MA. Specifically, the first back cover 1210*a* includes a first malleable area MA1 which overlaps the display panel 120, a first support area PA1 extending from the first malleable area MA1 to be far away from the second back cover 1210*b*, and a first fixing area FA1 extending from the first malleable area MA1 to the second back cover 1210*b*. Further, the second back cover 1210*b* includes a second support area PA2 which is fastened with the roller 151, a second malleable area MA2 extending from the second support area PA2 to the first back cover 1210*a*, and a second fixing area FA2 extending from the second malleable area MA2 to the first back cover 1210*a*.

A buffer member 140 is disposed on a partial area of the second back cover 1210*b*. The buffer member 140 is disposed on the second support area PA2 of the second back cover 1210*b* and a part of the second malleable area MA2 extending from the second support area PA2. That is, the display panel 120 may be gently bent on the first curved surface 151*b* of the roller 151 while buffering the stress on the first curved surface 151*b* of the roller 151 by the buffer member 140 having a cushion function. Therefore, the stress applied to the center lower end of the display panel 120 which is wound on the buffer member 140 may be alleviated.

Further, when the display panel 120 is fully wound, the buffer member 140 overlaps only the display area AA of the display panel 120. That is, the non-display area NA on both side portions of the display panel 120 does not overlap the buffer member 140. Therefore, the non-display area NA on both side portions of the display panel 120 is spaced apart from the roller 151 with the space S therebetween to be wound around the roller 151, similarly to FIG. 8B. Accordingly, the cracks of the elements disposed in the non-display area NA on both side portions of the display panel 120 may be suppressed.

In the display device 1200 according to still another embodiment of the present disclosure, the back cover 1210 is configured by the first back cover 1210*a* and the second back cover 1210*b* which are spaced apart from each other so as to correspond to various sizes of the display panel 120. As the size of the display device is gradually increased, the size of the display panel 120 is also increased. In this case, the back cover 1210 needs to be larger than the size of the display panel 120, a single back cover 1210 is necessarily manufactured to be large. However, when the single back cover 1210 is manufactured to correspond to the large size display device, there may be a big difficulty in the manufacturing process. Therefore, in the display device according to still another exemplary embodiment of the present disclosure, the back cover 1210 is configured by the first back cover 1210*a* and the second back cover 1210*b* to use the first back cover 1210*a* and the second back cover 1210*b* which are smaller than the display device. Further, the first back cover 1210*a* and the second back cover 1210*b* are fixed by a base plate 180, a top cover 190, and a fixing member FM so that both the first back cover 1210*a* and the second back cover 1210*b* perform the function as the back cover 1210 of the related art and a back cover 1210 with a reduced size is manufactured. Therefore, the productivity may be improved.

Figure 13:
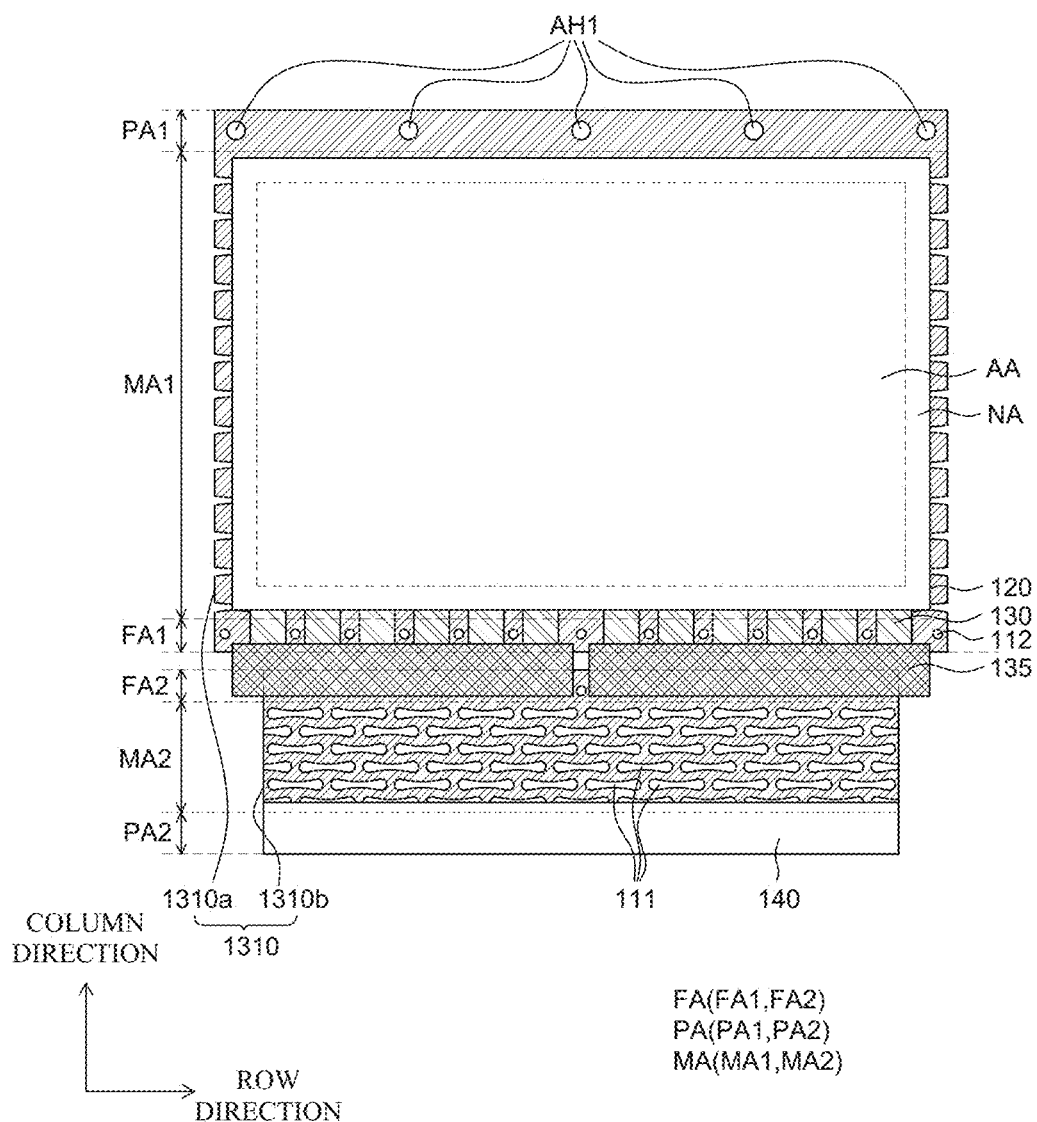
FIG. 13 is a plan view of a display part of a display device according to still another exemplary embodiment of the present disclosure.

FIG. 13 is a plan view of a display part of a display device according to still another exemplary embodiment of the present disclosure. In FIG. 13, for the convenience of description, only a display part DP of a display device 1300 is illustrated. The display device 1300 illustrated in FIG. 13 is substantially the same as the display device 900 illustrated in FIGS. 9 to 11 except for a back cover 1310, so that a redundant description will be omitted.

Referring to FIG. 13, the back cover 1310 includes a first back cover 1310*a* and a second back cover 1310*b* having a width smaller than a width of the first back cover 1310*a*. In this case, the first back cover 1310*a* and the second back cover 1310*b* may be separately formed.

The first back cover 1310*a* overlaps the display panel 120. The second back cover 1310*b* is disposed to be fixed to the roller 151. The first back cover 1310*a* and the second back cover 1310*b* are disposed to be spaced apart from each other. That is, a space is disposed between the first back cover 1310*a* and the second back cover 1310*b*. The first back cover 1310*a* and the second back cover 1310*b* are connected by the base plate 180 and the top cover 190.

The first back cover 1310*a* includes a first malleable area MA1 which overlaps the display panel 120, a first support area PA1 extending from the first malleable area MA1 to be far away from the second back cover 1310*b*, and a first fixing area FA1 extending from the first malleable area MA1 to the second back cover 1310*b*. In this case, the first support area PA1, the first malleable area MA1, and the first fixing area FA1 of the first back cover 1310*a* have the same width. That is, the first back cover 1310*a* may be defined as areas having the same width in a row direction.

The second back cover 1310*b* has a horizontal width which is smaller than a horizontal width of the first back cover 1310*a* and the display panel 120. The second back cover 1310*b* includes a second support area PA2 which is fastened with the roller 151, a second malleable area MA2 extending from the second support area PA2 to the first back cover 1310*a*, and a second fixing area FA2 extending from the second malleable area MA2 to the first back cover 1310*a*. In this case, the second support area PA2, the second malleable area MA2, and the second fixing area FA2 of the second back cover 1310*b* have the same width. That is, the second back cover 1310*b* may be defined as areas having the same width in a row direction.

A buffer member 140 is disposed on a partial area of the second back cover 1310*b*. The buffer member 140 is disposed on the second support area PA2 of the second back cover 1310*b* and a part of the second malleable area MA2 extending from the second support area PA2. That is, the display panel 120 may be gently bent on the first curved surface 151b of the roller 151 while buffering the stress on the first curved surface 151b of the roller 151 by the buffer member 140 having a cushion function. Therefore, the stress applied to the center lower end of the display panel 120 which is wound on the buffer member 140 may be alleviated.

Further, when the display panel 120 is fully wound, the buffer member 140 and the second back cover 1310b overlap only the display area AA of the display panel 120. That is, the non-display area NA on both side portions of the display panel 120 does not overlap the buffer member 140 and the second back cover 1310b. Therefore, the non-display area NA on both side portions of the display panel 120 is spaced apart from the roller 151 with the space S therebetween to be wound around the roller 151 one turn, similarly to FIG. 11. Accordingly, the crack of the elements disposed in the non-display area NA on both side portions of the display panel 120 may be more effectively suppressed.

In the display device 1300 according to still another embodiment of the present disclosure, the back cover 1310 is configured by the first back cover 1310a and the second back cover 1310b which are spaced apart from each other to form the back cover 1310 so as to correspond to various sizes of the display panel 120. That is, the back cover 1310 is configured by the first back cover 1310a and the second back cover 1310b to use the first back cover 1310a and the second back cover 1310b with a smaller size than the display device 1300. Therefore, the back cover 1310 with a smaller size may be produced so that the productivity may be improved as compared with the single back cover configured to correspond to a large size display device.

<Experiment Result According to Various Shapes of Buffer Member>

Figure 14A:
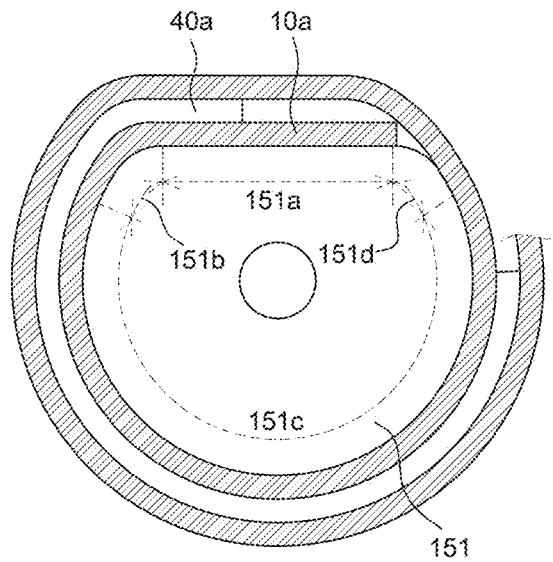
FIGS. 14A to 14D are cross-sectional views of display devices according to a comparative embodiment and an exemplary embodiment.
Figure 14B:
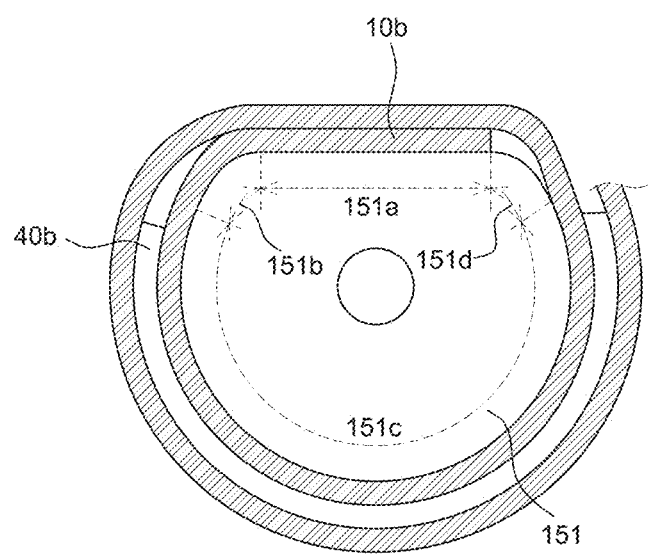
Figure 14C:
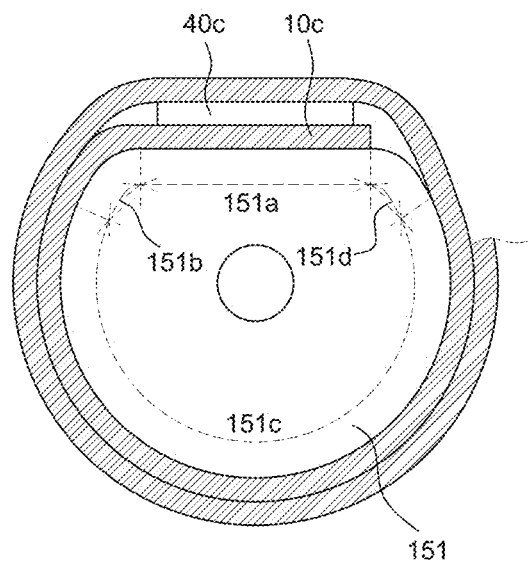
Figure 14D:
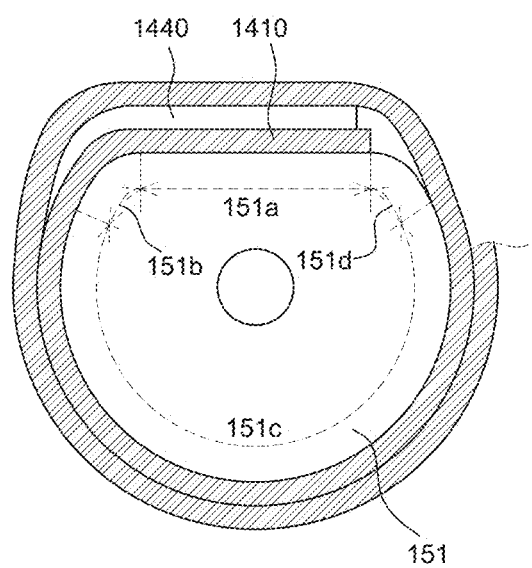

FIGS. 14A to 14D are cross-sectional views of display devices according to a comparative embodiment and an exemplary embodiment. FIG. 14A illustrates a display device according to a first comparative embodiment (comparative embodiment 1), FIG. 14B illustrates a display device according to a second comparative embodiment (comparative embodiment 2), and FIG. 14C illustrates a display device according to a third comparative embodiment (comparative embodiment 3). FIG. 14D schematically illustrates display devices 100, 900, 1200, and 1300 according to various exemplary embodiments of the present disclosure. Here, a buffer member 1440 of FIG. 14D is the same as the buffer member 140 as described above with reference to FIGS. 1A to 13, and all the back covers 110, 910, 1210, and 1310 of FIGS. 1A to 13 may be applied as the structure of the back cover 1410. In FIGS. 14A to 14D, for the convenience of description, only the roller 151, a part of the back cover 10a, 10b, 10c, 1410, and the buffer member 40a, 40b, 40c, 1440 are schematically illustrated.

Referring to FIG. 14A, the buffer member 40a is disposed so as to correspond to a part of a flat surface 151a, a first curved surface 151b, and a second curved surface 151c of a roller 151. Referring to FIG. 14B, the buffer member 40b is disposed so as to correspond only to a second curved surface 151c of the roller 151. Referring to FIG. 14C, the buffer member 40c is disposed so as to correspond only to a flat surface 151a of the roller 151. Referring to FIG. 14D, the buffer member 1440 is disposed so as to correspond to the flat surface 151a and the first curved surface 151b of the roller 151.

Table 1 illustrates whether a crack is generated in accordance with the number of times of repeated winding and unwinding of the display devices according to the comparative embodiments and the exemplary embodiment of FIGS. 14A to 14D.

TABLE 1

|  | Comparative Embodiment 1 | Comparative Embodiment 2 | Comparative Embodiment 3 | Exemplary embodiment |
|---|---|---|---|---|
| Whether crack is generated in accordance with number of times of winding | Normal until 900 times | Crack is generated at 70 times | Crack is generates within 50 times | Normal at 23,000 times |

According to the first comparative embodiment of FIG. 14A, crack was not generated until 900 times. However, the buffer member 40a is formed even at the boundary of the second curved surface 151c and the third curved surface 151d so that a linear section may be formed on the third curved surface 151d of the roller 151. Therefore, when the display panel 120 was wound, a light-transmissive film above the display panel 120 such as the polarizer film was peeled off on the third curved surface 151d of the roller 151.

According to the second comparative embodiment of FIG. 14B, the crack was generated at 70 times. That is, since the buffer member 140b is disposed only on the second curved surface 151c, a radius of curvature of the first curved surface 151b of the roller 151 is not large enough to suppress the crack on the display panel 120. Further, the buffer member 40b is not disposed on the first curved surface 151b so that a space by the buffer member 40b is hardly generated between the non-display area NA of both side lower ends of the display panel 120 and the roller 151, on the first curved surface 151b. In other words, the non-display area NA on both side lower ends of the display panel 120 is not wound around the roller 151 while being floated from the roller 151. Therefore, the display panel 120 is wound around the roller 151 with a smaller radius of curvature while being in direct contact with the roller 151 so that the stress is concentrated onto the non-display area NA of both side lower ends of the display panel 120 to cause the crack.

According to the third comparative embodiment of FIG. 14C, the crack was generated within 50 times. In FIG. 14C, the buffer member 40c is disposed only on the flat surface 151a so that all a center lower end and both side lower ends of the display panel 120 are wound around the roller 151 on the first curved surface 151b of the roller 151 while being floated. In this case, the center lower end of the display panel 120 is connected to the display area AA and the flexible film 130 by the routing signal line. Therefore, the center lower end of the display panel 120 where the routing signal line is disposed and the connection area of the display panel 120 and the flexible film 130 are disposed on the roller 151 while being floated. Accordingly, the center lower end of the display panel 120 and the connection area of the display panel 120 and the flexible film 130 are not sufficiently supported so that crack may be generated.

In the exemplary embodiment of FIG. 14D, the crack was not yet generated at 23,000 times. That is, the display devices 100, 900, 1200, 1300 according to the exemplary embodiment of the present disclosure have a buffer member 1440 disposed so as to correspond to the flat surface 151a and the first curved surface 151b of the roller 151. Therefore, the crack of the display panel 120 caused by a stress which is concentrated on the first curved surface 151b of the roller

151 may be suppressed. Therefore, the cracks of the driving part disposed at both side portions of the display panel 120 and the routing signal line disposed at the center lower end of the display panel 120 are suppressed to improve the reliability of the display device.

The exemplary embodiments of the present disclosure can also be described as follows:

According to an aspect of the present disclosure, there is provided a display device. The display device includes a display panel in which a plurality of pixels is defined. The display device further includes a back cover configured to be rolled together with the display panel. The display device further includes a roller winding or unwinding the back cover and the display panel, and including a flat surface and a curved surface. The display device further includes a buffer member covering at least a part of the back cover fixed to the roller, and having a width smaller than a width of the display panel.

The buffer member may be disposed over the flat surface and a part of the curved surface adjacent to the flat surface.

The display panel may include a display area and a non-display area at both side portions of the display area and the width of the buffer member may be equal to or smaller than a width of the display area.

When the display panel and the back cover are fully wound, the buffer member may overlap the display area of the display panel.

A driving part which drives the display area may be disposed in the non-display area.

The curved surface of the roller may include a first curved surface extending from one end of the flat surface, a second curved surface extending from the first curved surface, and having a radius of curvature larger than a radius of curvature of the first curved surface and a third curved surface extending from the other end of the flat surface to be connected to the second curved surface. The buffer member may be disposed so as to correspond to the flat surface and the first curved surface.

The back cover may include a first back cover on which the display panel is disposed and a second back cover which is fixed to the roller, and a width of the first back cover may be equal to a width of the second back cover.

The back cover may include a first back cover on which the display panel is disposed and a second back cover which is fixed to the roller, and a width of the first back cover may be larger than a width of the second back cover.

The width of the second back cover may be equal to the width of the buffer member.

The first back cover and the second back cover may be separated from each other.

According to another aspect of the present disclosure, there is provided a display device. The display device includes a display panel including a display area and a non-display area on both side portions of the display area. The display device further includes a back cover configured to be rolled together with the display panel. The display device further includes a roller winding or unwinding the back cover and the display panel, and including a flat surface and a curved surface. The display device further includes a buffer member covering at least a part of the back cover fixed to the roller, and disposed so as to correspond to the display area of the display panel.

The buffer member may be disposed over the flat surface and a part of the curved surface adjacent to the flat surface.

The back cover may include a first back cover on which the display panel is disposed and a second back cover which is fixed to the roller, and when the display panel and the back cover are fully unwound, the buffer member may be disposed so as to cover at least a part of the second back cover.

A width of the first back cover may be equal to a width of the second back cover.

When the display panel and the back cover are fully wound, a lowermost end of the display area may overlap the first back cover, the second back cover, and the buffer member, and a lowermost end of the non-display area may overlap the first back cover and the second back cover.

A width of the first back cover may be larger than a width of the second back cover.

The width of the second back cover may be equal to a width of the buffer member.

When the display panel and the back cover are fully wound, a lowermost end of the display area may overlap the first back cover, the second back cover, and the buffer member, and a lowermost end of the non-display area may overlap the first back cover.

The first back cover and the second back cover may be separated from each other.

A driving part which drives the display area may be disposed in the non-display area.

It will be apparent to those skilled in the art that various modifications and variations can be made in the display device of the present disclosure without departing from the technical idea or scope of the disclosure. Thus, it is intended that the present disclosure cover the modifications and variations of this disclosure provided they come within the scope of the appended claims and their equivalents.

What is claimed is:
1. A display device, comprising:
a display panel in which a plurality of pixels is defined;
a back cover configured to be rolled together with the display panel;
a roller configured to wind or unwind the back cover and the display panel, the roller including:
a flat surface; and
a curved surface; and
a buffer member covering at least a part of the back cover fixed to the roller, the buffer member having a width smaller than a width of the display panel and smaller than a width of the roller in a direction parallel to the roller.

2. The display device according to claim 1, wherein the buffer member is disposed over the flat surface and a part of the curved surface adjacent to the flat surface.

3. The display device according to claim 1, wherein:
the display panel includes a display area and a non-display area at both side portions of the display area; and
the width of the buffer member is equal to or smaller than a width of the display area.

4. The display device according to claim 3, wherein, when the display panel and the back cover are fully wound, the buffer member overlaps the display area of the display panel.

5. The display device according to claim 3, wherein a moving part, which drives the display area, is disposed in the non-display area.

6. The display device according to claim 1, wherein:
the curved surface of the roller includes:
a first curved surface extending from one end of the flat surface;
a second curved surface extending from the first curved surface, the second curved surface having a radius of curvature larger than a radius of curvature of the first curved surface; and a third curved surface extending from the other end of the flat surface to be connected to the second curved surface; and wherein the buffer member is disposed to correspond to the flat surface and the first curved surface.

7. The display device according to claim 1, wherein:
the back cover includes:
a first back cover on which the display panel is disposed; and
a second back cover, which is fixed to the roller; and
a width of the first back cover is equal to a width of the second back cover.

8. The display device according to claim 7, wherein the first back cover and the second back cover are separated from each other.

9. The display device according to claim 1, wherein:
the back cover includes:
a first back cover on which the display panel is disposed; and
a second back cover, which is fixed to the roller; and
a width of the first back cover is larger than a width of the second back cover.

10. The display device according to claim 9, wherein the width of the second back cover is equal to the width of the buffer member.

11. A display device, comprising:
a display panel including a display area and a non-display area on both side portions of the display area so that the display area has a smaller width than the display panel;
a back cover configured to be rolled together with the display panel;
a roller configured to wind or unwind the back cover and the display panel, the roller including:
a flat surface; and
a curved surface; and
a buffer member covering at least a part of the back cover fixed to the roller, the buffer member having a width corresponding to the width of the display area of the display panel and smaller than a width of the roller in a direction parallel to the roller.

12. The display device according to claim 11, wherein the buffer member is disposed over the flat surface and a part of the curved surface adjacent to the flat surface.

13. The display device according to claim 11, wherein:
the back cover includes:
a first back cover on which the display panel is disposed; and
a second back cover, which is fixed to the roller; and
when the display panel and the back cover are fully unwound, the buffer member is disposed to cover at least a part of the second back cover.

14. The display device according to claim 13, wherein a width of the first back cover is equal to a width of the second back cover.

15. The display device according to claim 14, wherein, when the display panel and the back cover are fully wound:
a lowermost end of the display area overlaps the first back cover, the second back cover, and the buffer member; and
a lowermost end of the non-display area overlaps the first back cover and the second back cover.

16. The display device according to claim 13, wherein a width of the first back cover is larger than a width of the second back cover.

17. The display device according to claim 16, wherein the width of the second back cover is equal to a width of the buffer member.

18. The display device according to claim 16, wherein, when the display panel and the back cover are fully wound:
a lowermost end of the display area overlaps the first back cover, the second back cover, and the buffer member; and
a lowermost end of the non-display area overlaps the first back cover.

19. The display device according to claim 13, wherein the first back cover and the second back cover are separated from each other.

20. The display device according to claim 11, wherein a moving part, which drives the display area, is disposed in the non-display area.

* * * * *